(12) United States Patent
Gaab et al.

(10) Patent No.: US 12,383,985 B2
(45) Date of Patent: Aug. 12, 2025

(54) SUBSTRATE CUTTING AND SEPARATING SYSTEMS AND METHODS

(71) Applicant: CORNING INCORPORATED, Corning, NY (US)

(72) Inventors: Andreas Simon Gaab, Grobenzell (DE); Richard Anthony Gaona, Novato, CA (US); Nicolai Martin Haenel, Bayern (DE); Dale Humphrey, Santa Rosa, CA (US); Ralf Joachim Terbrueggen, Bavaria (DE); John Eric Tyler, Napa, CA (US)

(73) Assignee: Corning Incorporated, Corning, NY (US)

( * ) Notice: Subject to any disclaimer, the term of this patent is extended or adjusted under 35 U.S.C. 154(b) by 544 days.

(21) Appl. No.: 17/554,357

(22) Filed: Dec. 17, 2021

(65) Prior Publication Data

US 2022/0193831 A1 Jun. 23, 2022

Related U.S. Application Data

(60) Provisional application No. 63/248,700, filed on Sep. 27, 2021, provisional application No. 63/128,279, filed on Dec. 21, 2020.

(51) Int. Cl.
*B23K 26/53* (2014.01)
*B23K 26/00* (2014.01)
(Continued)

(52) U.S. Cl.
CPC .......... *B23K 26/53* (2015.10); *B23K 26/0006* (2013.01); *B23K 26/70* (2015.10); *B23K 2103/54* (2018.08)

(58) Field of Classification Search
CPC ............ B23K 2103/54; B23K 26/0006; B23K 26/0624; B23K 26/53; B23K 26/70;
(Continued)

(56) References Cited

U.S. PATENT DOCUMENTS 11,773,004 B2 * 10/2023 Hackert ............... B23K 26/364
428/131
2005/0009301 A1 1/2005 Nagai et al.
(Continued)

FOREIGN PATENT DOCUMENTS

CN 102218777 A 10/2011
CN 103079747 A 5/2013
(Continued)

OTHER PUBLICATIONS

Borghi et al., "M2 factor of Bessel-Gauss beams", Optics Letters, vol. 22, No. 5, 1997, pp. 262-264.
(Continued)

*Primary Examiner* — Brian W Jennison
*Assistant Examiner* — Adam M Eckardt
(74) *Attorney, Agent, or Firm* — Womble Bond Dickinson (US) LLP

(57) ABSTRACT

A method of forming a plurality of defects within a substrate with a laser beam focal line using a laser beam, each defect of the plurality of defects being a damage track within the substrate with a diameter of about 10 microns or less, the plurality of defects forming a contour line on the substrate. The substrate having a first surface and a second surface that is opposite from the first surface. The method further includes exerting (i) a first force on the first surface of the substrate at a location that is adjacent to the contour line and (ii) a second force on the second surface of the substrate at a location that is on the contour line. Additionally, the method includes breaking the substrate along the contour
(Continued)

line and into a first substrate portion and a second substrate portion.

19 Claims, 14 Drawing Sheets

(51) Int. Cl.
    *B23K 26/70*     (2014.01)
    *B23K 103/00*     (2006.01)

(58) Field of Classification Search
    CPC .............. C03B 33/0222; C03B 33/033; H01L 21/67092; Y02P 40/57
    See application file for complete search history.

(56) References Cited

U.S. PATENT DOCUMENTS

| | | |
|---|---|---|
| 2011/0056922 A1 | 3/2011 | Ueki |
| 2011/0136322 A1 | 6/2011 | Sato et al. |
| 2013/0323469 A1 | 12/2013 | Abramov et al. |
| 2017/0028505 A1 | 2/2017 | Hosseini et al. |
| 2017/0243786 A1 | 8/2017 | Yoshino et al. |
| 2018/0057390 A1 | 3/2018 | Hackert et al. |
| 2020/0290918 A1 | 9/2020 | Basit et al. |
| 2021/0155525 A1* | 5/2021 | Nogret .................... C03B 33/04 |

FOREIGN PATENT DOCUMENTS

| | | | | |
|---|---|---|---|---|
| CN | 104736489 A | 6/2015 | | |
| CN | 106102983 A | 11/2016 | | |
| CN | 110722271 A | 1/2020 | | |
| CN | 111183121 A | 5/2020 | | |
| JP | 2011119548 A | 6/2011 | | |
| JP | 2011212963 A | * 10/2011 | .............. | B28D 5/04 |
| JP | 2015122402 A | 7/2015 | | |
| JP | 2018519229 A | 7/2018 | | |
| JP | 2020001072 A | 1/2020 | | |
| KR | 10-2020-0002633 A | 1/2020 | | |
| KR | 20200002633 A | * 1/2020 | | |
| WO | 2012/006736 A2 | 1/2012 | | |
| WO | 2015/113026 A2 | 7/2015 | | |
| WO | 2019/055751 A1 | 3/2019 | | |

OTHER PUBLICATIONS

Siegman, "New developments in laser resonators", SPIE Symposium Series, vol. 1224, 1990, pp. 2-14.

International Search Report and Written Opinion of the International Searching Authority; PCT/US2021/061704; mailed on Apr. 20, 2022, 11 pages; European Patent Office.

Japanese Office action for Application No. 2023-537275, dated Dec. 5, 2024, 7 pages.

Chinese Office action for application No. 202180091814.9, dated May 16, 2025, 9 pages.

* cited by examiner

SUBSTRATE CUTTING AND SEPARATING SYSTEMS AND METHODS

This application claims the benefit of priority under 35 U.S.C. § 119 of U.S. Provisional Application Ser. No. 63/128,279 filed on Dec. 21, 2020 and U.S. Provisional Application Ser. No. 63/248,700 filed on Sep. 27, 2021, the content of which is relied upon and incorporated herein by reference in its entirety

FIELD

The present disclosure generally relates to apparatuses and methods for cutting and separating substrates, and more particularly, to cutting and separating substrates using a laser beam and a breaker system.

BACKGROUND

The area of laser processing of materials encompasses a wide variety of applications that involve cutting, drilling, milling, welding, melting, etc., of different types of materials. Among these processes, one that is of particular interest is cutting or separating different types of substrates comprised of such materials as glass, sapphire, or fused silica for thin film transistors (TFT) or display materials for electronic devices. The cutting or separating of the substrates conventionally requires a laser beam to form a scribe line along the substrate. Next, either a mechanical force or another laser is applied to the scribe line to cut or separate the substrate along the scribe line.

However, such conventional systems often cause unwanted chipping or cracking in the substrate. Furthermore, such conventional systems can damage a coating applied to a surface of the substrate. Accordingly, a need exists to improve the cutting and separating of substrates using a laser beam.

BRIEF SUMMARY

Therefore, what is needed is a system that cuts and separates a substrate without causing such chipping and cracking in the substrate. Furthermore, what is needed is a system that provides good edge quality with such a cutting and separating process. Embodiments of the present disclosure include a system that comprises a laser processing system and a substrate breaking system to precisely and accurately cut and separate a substrate. More specifically, the laser processing system uses a laser beam to precisely form a contour line in the substrate. The substrate breaking system then separates the substrate along the contour line without damaging the substrate or a coating applied thereon. Such produces an efficient and easy system to accurately cut and separate a substrate and to provide a cut substrate with enhanced edge quality. Furthermore, the system disclosed herein precisely cuts and separates the substrate while preventing any cracking or chipping of the substrate during the process.

According to a first aspect, a method of forming a plurality of defects within a substrate with a laser beam focal line using a laser beam is disclosed, each defect of the plurality of defects being a damage track within the substrate with a diameter of about 10 microns or less, the plurality of defects forming a contour line on the substrate. The substrate has a first surface and a second surface that is opposite from the first surface. The method further comprises exerting (i) a first force on the first surface of the substrate at a location that is adjacent to the contour line and (ii) a second force on the second surface of the substrate at a location that is on the contour line. Additionally, the method comprises breaking the substrate along the contour line and into a first substrate portion and a second substrate portion.

According to a second aspect a system is disclosed that comprises a laser processing system comprising a beam source configured to output a laser beam that is focused into a laser beam focal line and a substrate breaking system comprising a first set of breaker bars and a flexible membrane. The first set of breaker bars comprising a first breaker bar with a first edge, a second breaker bar with a second edge, and a third breaker bar with a third edge. The first breaker bar and the second breaker bar being disposed on a first side of the flexible membrane and the third breaker bar being disposed on a second side of the flexible membrane.

Additional features and advantages of the processes and systems described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

Figure 1:
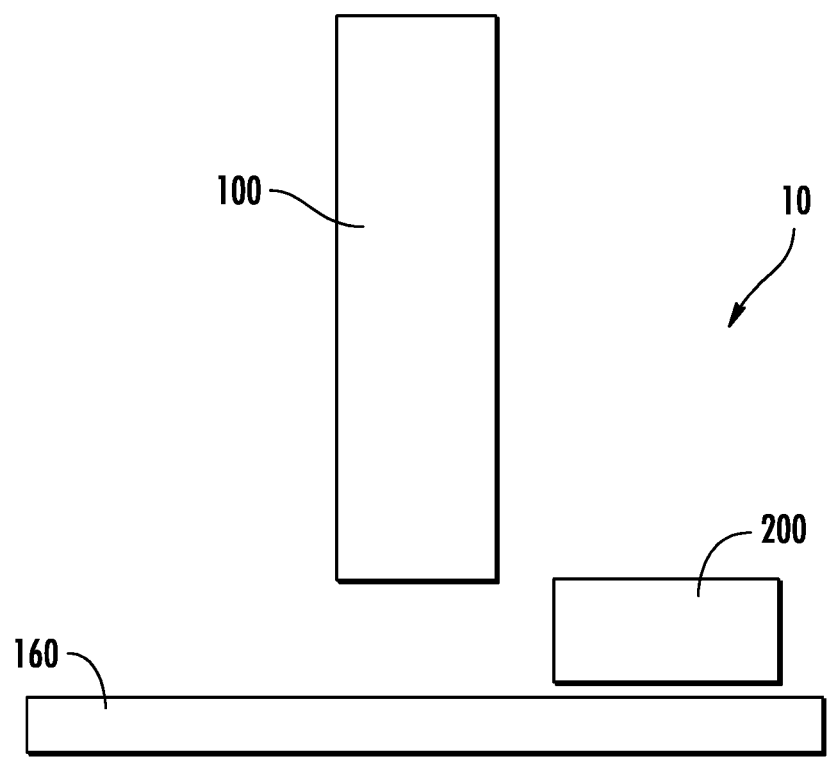
FIG. 1 schematically depicts a system for cutting and separating a substrate, according to one or more embodiments described herein.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

Reference will now be made in detail to embodiments of a system and processes for laser processing transparent workpieces examples of which are illustrated in the accompanying drawings. Whenever possible, the same reference numerals will be used throughout the drawings to refer to the same or like parts.

As used herein, "laser processing" comprises directing a laser beam onto and/or into a substrate. In some embodiments, laser processing further comprises translating the laser beam relative to the substrate, for example, along a contour line, along a modification line, or along another pathway. Examples of laser processing include using a laser beam to form a contour comprising a series of defects that extend into the substrate and using a laser beam to form a modification track in the substrate.

As used herein, "contour," refers to a set of defects in a substrate formed by translating a laser along a line. As used herein, a contour refers to a virtual two dimensional shape or path in or on a substrate. Thus, while a contour itself is a virtual shape, the contour may be manifest, for example, by a fault line or a crack.

As used herein, "contour line," denotes a linear, angled, polygonal or curved line on a surface of a substrate that defines the path traversed by the laser beam as it is moved within the plane of the substrate and that is created by the set of defects. A contour line defines a surface of desired separation in the substrate. A contour line may be formed by creating a plurality of defects in the substrate using various techniques, for example by directing a pulsed laser beam at successive points along the contour line.

As used herein, a "fault line" refers to a series of closely spaced defect lines extending along and approximating a contour.

As used herein, a "defect" refers to a region of modified material (e.g., a region of modified refractive index relative to the bulk material), void space, crack, scratch, flaw, hole, perforation or other deformities in the substrate. These defects may be referred to, in various embodiments herein, as defect lines or damage tracks. A defect line or damage track is formed by a laser beam directed onto a single position of the substrate, for a single laser pulse or multiple pulses at the same location. Translating the laser along the substrate results in multiple defect lines that form a contour line. For a line focus laser, the defect may have a linear shape.

As used herein, the phrase "beam cross section" refers to the cross section of a laser beam along a plane perpendicular to a beam propagation direction of the laser beam, for example, along an X-Y plane when the beam propagation direction is in a Z direction.

As used herein, "beam spot" refers to a cross section of a laser beam (e.g., a beam cross section) in the impingement surface, i.e., the surface of a substrate in closest proximity to the laser optics.

As used herein, "impingement surface" refers to the surface of a substrate in closest proximity to the laser optics.

As used herein, "upstream" and "downstream" refer to the relative position of two locations or components along a beam pathway with respect to a beam source. For example, a first component is upstream from a second component if the first component is closer to the laser optics along the path traversed by the laser beam than the second component.

As used herein, "laser beam focal line," refers to pattern of interacting (e.g., crossing) light rays of a laser beam that form a linear, elongated focused region, parallel to an optical axis. The laser beam focal line comprises aberrated light rays that interact (e.g., cross) an optical axis of the laser beam at different positions along the optical axis. Furthermore, the laser beam focal lines described herein are formed using a quasi-non-diffracting beam, mathematically defined in detail below.

The phrase "transparent substrate," as used herein, means a substrate formed from glass, glass-ceramic or other material which is transparent, where the term "transparent," as used herein, means that the material has an optical absorption of less than 20% per mm of material depth, such as less than 10% per mm of material depth for the specified pulsed laser wavelength, or such as less than 1% per mm of material depth for the specified pulsed laser wavelength. Unless otherwise specified, the material has an optical absorption of less than about 20% per mm of material depth. Transparent substrates may comprise glass workpieces formed from glass compositions, such as borosilicate glass, soda-lime glass, aluminosilicate glass, alkali aluminosilicate, alkaline earth aluminosilicate glass, alkaline earth boro-aluminosilicate glass, fused silica, or crystalline materials such as sapphire, silicon, silicon carbide, gallium arsenide, or combinations thereof. In some embodiments the substrate may be strengthened via thermal tempering before or after laser processing the substrate. In some embodiments, the glass may be ion-exchangeable, such that the glass composition can undergo ion-exchange for glass strengthening before or after laser processing the substrate. For example, the substrate may comprise ion exchanged and ion exchangeable glass, such as Corning Gorilla® Glass available from Corning Incorporated of Corning, NY (e.g., code 2318, code 2319, and code 2320). Further, such ion exchanged glasses may have coefficients of thermal expansion (CTE) of from about 6 ppm/° C. to about 10 ppm/° C. Other exemplary transparent substrates comprise EAGLE XG® and CORNING LOTUS' available from Corning Incorporated of Corning, NY. Moreover, the substrate may comprise other components which are transparent to the wavelength of the laser, for example, crystals such as sapphire or zinc selenide.

In an ion exchange process, ions in a surface layer of the substrate are replaced by larger ions having the same valence or oxidation state, for example, by partially or fully submerging the substrate in an ion exchange bath. Replacing smaller ions with larger ions causes a layer of compressive stress to extend from one or more surfaces of the substrate to a certain depth within the substrate, referred to as the depth of layer. The compressive stresses are balanced by a layer of tensile stresses (referred to as central tension) such that the net stress in the glass sheet is zero. The formation of compressive stresses at the surface of the glass sheet makes the glass strong and resistant to mechanical damage and, as such, mitigates catastrophic failure of the glass sheet for flaws which do not extend through the depth of layer. In some embodiments, smaller sodium ions in the surface layer of the substrate are exchanged with larger potassium ions. In some embodiments, the ions in the surface layer and the larger ions are monovalent alkali metal cations, such as Li+(when present in the glass), Na+, K+, Rb+, and Cs+. Alternatively, monovalent cations in the surface layer may be replaced with monovalent cations other than alkali metal cations, such as Ag+, Tl+, Cu+, or the like.

Referring now to FIG. 1, system 10 is schematically depicted as comprising a laser processing system 100 and a substrate breaker system 200. As discussed further below, the laser processing system 100 is configured to modify a substrate 160 by forming defects (e.g., damage tracks) in the substrate. Substrate breaker system 200 may then separate and break the substrate along a line formed by the defects. Such separates and breaks the substrate 160 into at least two portions. Thus, the combination of the laser processing system 100 and the substrate breaker system 200 together cut and separate a substrate into at least two portions.

The substrate 160 (which may also be referred to as a "workpiece" or a "wafer") may be a glass, glass-ceramic, or ceramic, exemplary materials of which are disclosed above. Thus, for example, the substrate 160 may be a transparent substrate. Alternatively, the substrate 160 is a semiconductor wafer or an amorphous substrate having a plurality of dies fabricated thereon. In some embodiments, the substrate 160 comprises a stack of substrates, which may be secured together with, for example, an adhesive or bonding. In some embodiments, the bonding may be via eutectic, anodic, or fusion bonding. The stack of substrates 160 may comprise one or more intermediate layers therein.

The substrate 160 may have a thickness in a range of about 50 microns to about 10 mm, or from about 100 microns to about 5 mm, or from about 0.3 mm to about 3 mm.

In some embodiments, substrate 160 may comprise a coating disposed thereon. Exemplary coatings include, for example metallic, conductive (e.g. ITO and organic conductive coatings) and/or polymeric coatings. In other embodiments the substrate 160 may contain macro- or nano-surface structures generated by, for example, etching and/or bonding processes. Exemplary surface structures include voids, openings, and channels. The coatings and/or surface structures may be within or form an intermediate layer between substrates 160 within a stack of the substrates 160. In some embodiments, the substrate 160 comprises devices fabricated or disposed on the substrate 160. The devices can be, for example, semiconductor devices, photonic devices, MEMS (micro electromechanical system) devices, or lenses. The substrate 160 may be in any shape including, for example, rectangular or circular shape. In some embodiments, the substrate 160 is a circular wafer.

Figure 2A:
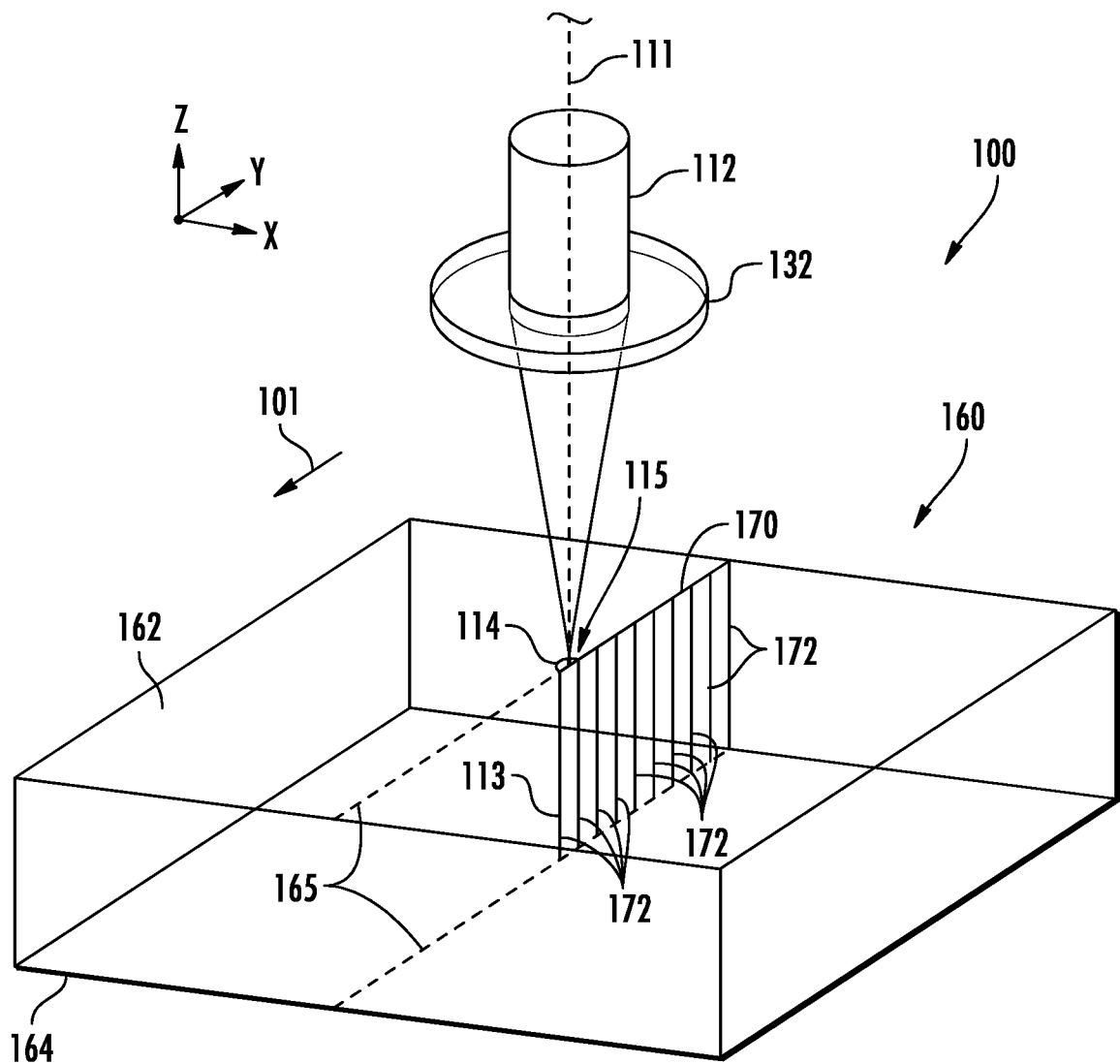
FIG. 2A schematically depicts a laser processing system of the system of FIG. 1, according to one or more embodiments described herein.
Figure 2B:
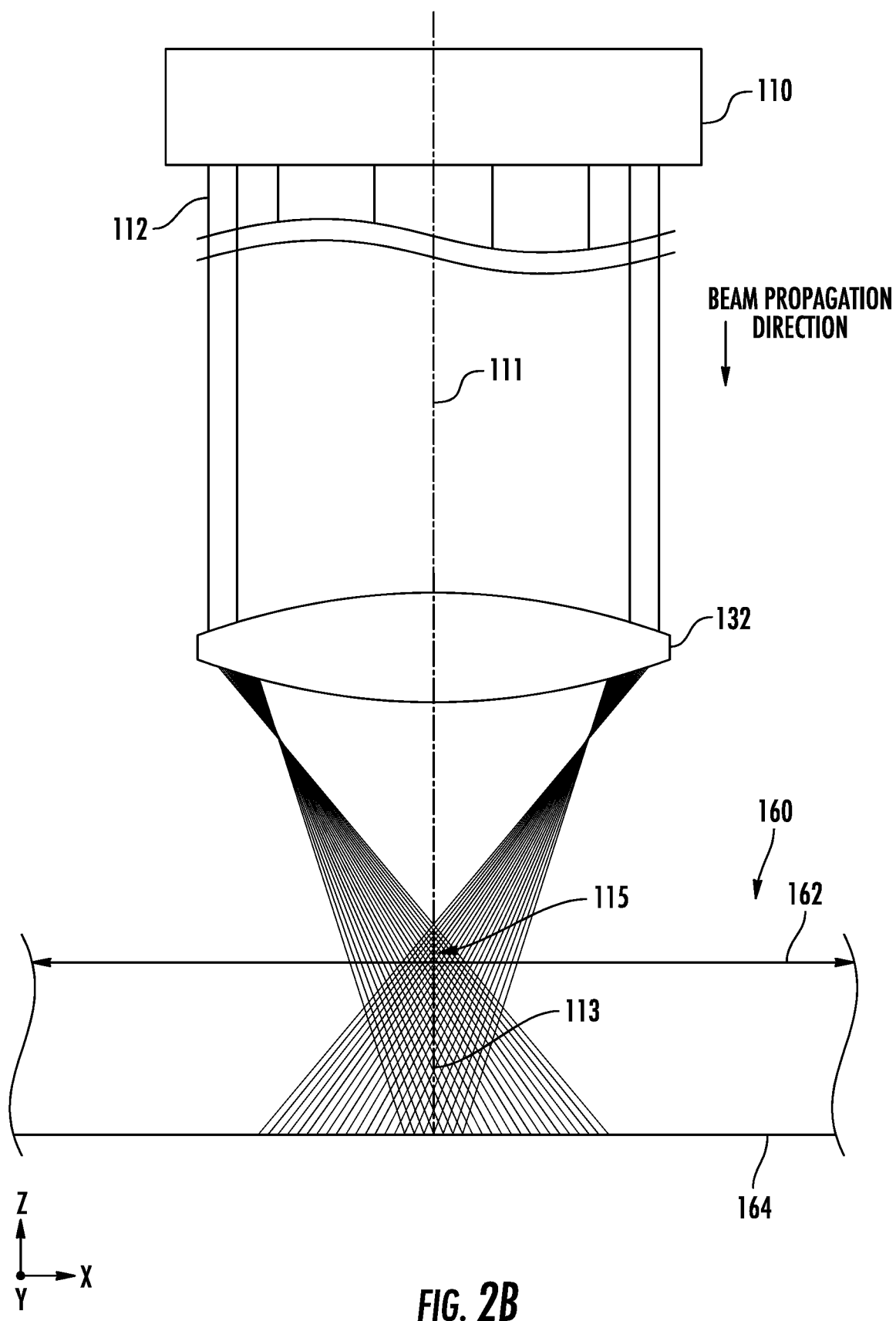
FIG. 2B schematically depicts the positioning of a laser beam focal line of the laser processing system of FIG. 1A, according to one or more embodiments described herein.

Referring now to FIGS. 2A and 2B, an exemplary substrate 160 is schematically depicted undergoing laser processing, according to the methods described herein, by laser processing system 100. In particular, FIG. 2A schematically depicts the formation of a contour line 165 comprising a plurality of defects 172, which may be used to separate the transparent workpieces 160. The contour line 165 comprising the plurality of defects 172 may be formed by processing the transparent workpiece 160 with a laser beam 112, which may comprise an ultra-short pulsed laser beam moving in a translation direction 101 along contour line 165. The defects 172 may extend, for example, through the depth of the transparent workpiece 160, and may, in this exemplary embodiment, be orthogonal to an impingement surface of the transparent workpiece 160. Further, the laser beam 112 initially contacts the substrate 160 at an impingement location 115, which is a specific location on the impingement surface. As depicted in FIGS. 2A and 2B, a first surface 162 of the substrate 160 comprises the impingement surface, however, it should be understood that in other embodiments, the laser beam 112 may instead initially irradiate a second surface 164 of the substrate 160. Furthermore, FIG. 2A depicts that the laser beam 112 forms a beam spot 114 projected onto the first surface 162 of the substrate 160.

FIGS. 2A and 2B depict the laser beam 112 propagating along a beam pathway 111 and oriented such that the laser beam 112 may be focused into a laser beam focal line 113 within the substrate 160, for example, using an aspheric optical element 120 (FIG. 2C), which may include, for example, an axicon and one or more lenses (e.g., a first lens 130 and a second lens 132, as described below and depicted in FIG. 2C). The position of the laser beam focal line 113 may be controlled along the Z-axis and about the Z-axis. Further, the laser beam focal line 113 may have a length in a range of from about 0.1 mm to about 100 mm or in a range of from about 0.1 mm to about 10 mm. Various embodiments may be configured to have a laser beam focal line 113 with a length of about 0.1 mm, about 0.2 mm, about 0.3 mm, about 0.4 mm, about 0.5 mm, about 0.7 mm, about 1 mm, about 2 mm, about 3 mm, about 4 mm, or about 5 mm e.g., from about 0.5 mm to about 5 mm. Further, the laser beam focal line 113 may be a portion of a quasi-non-diffracting beam, as defined in more detail below.

In operation, the laser beam 112 may be translated relative to the substrate 160 (e.g., in the translation direction 101) along the contour line 165 to form the plurality of defects 172 of the contour line 165. Directing or localizing the laser beam 112 into the substrate 160 generates an induced absorption within the substrate 160 and deposits enough energy to break chemical bonds in the substrate 160 at spaced locations along the contour line 165 to form the defects 172. According to one or more embodiments, the laser beam 112 may be translated across the substrate 160 by motion of the substrate 160 (e.g., motion of a translation stage 190 coupled to the substrate 160, as shown in FIG. 2C), motion of the laser beam 112 (e.g., motion of the laser beam focal line 113), or motion of both the substrate 160 and the laser beam focal line 113. By translating the laser beam focal line 113 relative to the substrate 160, the plurality of defects 172 may be formed in the substrate 160.

In some embodiments, the defects 172 may generally be spaced apart from one another by a distance along the contour line 165 of from about 0.1 µm to about 500 µm, for example, about 1 µm to about 200 µm, about 2 µm to about 100 µm, about 5 µm to about 20 µm, or the like. For example, suitable spacing between the defects 172 may be from about 0.1 µm to about 50 µm, such as from about 5 µm to about 15 µm, from about 5 µm to about 12 µm, from about 7 µm to about 15 µm, or from about 7 µm to about 12 µm. In some embodiments, a spacing between adjacent defects 172 may be about 50 µm or less, 45 µm or less, 40 µm or less, 35 µm or less, 30 µm or less, 25 µm or less, 20 µm or less, 15 µm or less, 10 µm or less, or the like.

As illustrated in FIG. 1A, the plurality of defects 172 of the contour line 165 extend into the substrate 160 and establish a path for crack propagation for separation of the substrate 160 into separate portions along the contour line 165. Each defect 172 may extend through an entire thickness of the substrate 160 or for less than the entire thickness. The formation of the plurality of defects 172 may be referred to herein as a nano-perforation step due to the small size of the defects 172. For example, each defect 172 may have a diameter of about 100 microns or less, or about 50 microns or less, or about 10 micron or less, or about 3 micron or less, or about 1 micron or less, or about 900 nm or less, or about 800 nm or less, or about 700 nm or less, or about 600 nm or less or about 500 nm or less, or about 400 nm or less, or in a range from about 200 nm to about 1 micron, or in a range from about 300 nm to about 800 nm. As discussed further below, the location of the plurality of defects 172 dictates where the glass substrate 160 will be separated during a subsequent breaking step.

Forming the contour line 165 comprises translating the laser beam 112 relative to the substrate 160 (e.g., in the translation direction 101) along the line 170 to form the plurality of defects 172 of the contour line 165. According to one or more embodiments, the laser beam 112 may be translated across the substrate 160 by motion of the substrate 160, motion of the laser beam 112 (e.g., motion of the laser beam focal line 113), or motion of both the substrate 160 and the laser beam 112, for example, using one or more translation stages 190 (FIG. 2C). By translating the laser beam focal line 113 relative to the substrate 160, the plurality of defects 172 may be formed in the substrate 160. Moreover, while the contour line 165 illustrated in FIG. 2A is linear, the contour line 165 may also be nonlinear (i.e., having a curvature). Curved contours may be produced, for example, by translating either the substrate 160 or laser beam focal line 113 with respect to the other in two dimensions instead of one dimension.

In embodiments, the substrate 160 is further acted upon in a subsequent separating step to induce separation of the substrate 160 along the contour line 165. As discussed further below, the subsequent separating step includes using the substrate breaker system 200 to apply a mechanical force to initiate and propagate a crack along the contour line 165.

Referring again to FIGS. 2A and 2B, the laser beam 112 used to form the defects 172 further has an intensity distribution I(X,Y,Z), where Z is the beam propagation direction of the laser beam 112, and X and Y are directions orthogonal to the direction of propagation, as depicted in the figures. The X-direction and Y-direction may also be referred to as cross-sectional directions and the X-Y plane may be referred to as a cross-sectional plane. The intensity distribution of the laser beam 112 in a cross-sectional plane may be referred to as a cross-sectional intensity distribution.

The laser beam 112 at the beam spot 114 or other cross sections may comprise a quasi-non-diffracting beam, for example, a beam having low beam divergence as mathematically defined below, by propagating the laser beam 112 (e.g., the laser beam 112, such as a Gaussian beam, using a beam source 110, such as a pulsed beam source) through an aspheric optical element 120, as described in more detail below with respect to the optical assembly 103 depicted in FIG. 2C. Beam divergence refers to the rate of enlargement of the beam cross section in the direction of beam propagation (i.e., the Z direction). One example beam cross section discussed herein is the beam spot 114 of the laser beam 112 projected onto the transparent workpiece 160. Example quasi-non-diffracting beams include Gauss-Bessel beams and Bessel beams.

Diffraction is one factor that leads to divergence of laser beams 112. Other factors include focusing or defocusing caused by the optical systems forming the laser beams 112 or refraction and scattering at interfaces. Laser beams 112 for forming the defects 172 of the contour line 165 may form laser beam focal lines 113 with low divergence and weak diffraction. The divergence of the laser beam 112 is characterized by the Rayleigh range $Z_R$, which is related to the variance $\sigma^2$ of the intensity distribution and beam propagation factor $M^2$ of the laser beam 112. Additional information on beam divergence can be found in the articles entitled "New Developments in Laser Resonators" by A.E. Siegman in SPIE Symposium Series Vol. 1224, p. 2 (1990) and "$M^2$ factor of Bessel-Gauss beams" by R. Borghi and M. Santarsiero in Optics Letters, Vol. 22(5), 262 (1997), the disclosures of which are incorporated herein by reference in their entirety. Additional information can also be found in the international standards ISO 11146-1:2005(E) entitled "Lasers and laser-related equipment—Test methods for laser beam widths, divergence angles and beam propagation ratios—Part 1: Stigmatic and simple astigmatic beams", ISO 11146-2:2005(E) entitled "Lasers and laser-related equipment—Test methods for laser beam widths, divergence angles and beam propagation ratios—Part 2: General astigmatic beams", and ISO 11146-3:2004(E) entitled "Lasers and laser-related equipment—Test methods for laser beam widths, divergence angles and beam propagation ratios—Part 3: Intrinsic and geometrical laser beam classification, propagation and details of test methods", the disclosures of which are incorporated herein by reference in their entirety.

Beam cross section is characterized by shape and dimensions. The dimensions of the beam cross section are characterized by a spot size of the beam. For a Gaussian beam, spot size is frequently defined as the radial extent at which the intensity of the beam decreases to $1/e^2$ of its maximum value, which is denoted as Ivo. The maximum intensity of a Gaussian beam occurs at the center (x=0 and y=0 (Cartesian) or r=0 (cylindrical)) of the intensity distribution and radial extent used to determine spot size is measured relative to the center.

Beams with axisymmetric (i.e. rotationally symmetric around the beam propagation axis Z) cross sections can be characterized by a single dimension or spot size that is measured at the beam waist location as specified in Section 3.12 of ISO 11146-1:2005(E). For a Gaussian beam, the spot size is equal to $w_o$, which corresponds to $2\sigma_0$, or $2\sigma_{0y}$. For an axisymmetric beam having an axisymmetric cross section, such as a circular cross section, $\sigma_{0x}=\sigma_{0y}$. Thus, for axisymmetric beams, the cross section dimension may be characterized with a single spot size parameter, where $w_o=2\sigma_0$. Spot size can be similarly defined for non-axisymmetric beam cross sections where, unlike an axisymmetric beam, $\sigma_{0x} \neq \sigma_{0y}$. Thus, when the spot size of the beam is non-axisymmetric, it is necessary to characterize the cross-sectional dimensions of a non-axisymmetric beam with two spot size parameters: $w_{ox}$ and $w_{oy}$ in the x-direction and y-direction, respectively, where $$w_{ox} = 2\sigma_{0x} \quad (1)$$

$$w_{oy} = 2\sigma_{0y} \quad (2)$$

Further, the lack of axial (i.e. arbitrary rotation angle) symmetry for a non-axisymmetric beam means that the results of a calculation of values of $\sigma_{0x}$ and $\sigma_{0y}$ will depend on the choice of orientation of the X-axis and Y-axis. ISO 11146-1:2005(E) refers to these reference axes as the principal axes of the power density distribution (Section 3.3-3.5) and in the following discussion we will assume that the X and Y axes are aligned with these principal axes. Further, an angle $\phi$ about which the X-axis and Y-axis may be rotated in the cross-sectional plane (e.g., an angle of the X-axis and Y-axis relative to reference positions for the X-axis and Y-axis, respectively) may be used to define minimum ($w_{o,min}$) and maximum values ($w_{o,max}$) of the spot size parameters for a non-axisymmetric beam:

$$w_{o,min} = 2\sigma_{0,min} \quad (3)$$

$$w_{o,max} = 2\sigma_{0,max} \quad (4)$$

where $2\sigma_{0,min} = 2\sigma_{0x}(\phi_{min,x}) = 2\sigma_{0y}(\phi_{min,y})$ and $2\sigma_{0,max} = 2\sigma_{0x}(\phi_{max,x}) = 2\sigma_{0y}(\phi_{max,y})$. The magnitude of the axial asymmetry of the beam cross section can be quantified by the aspect ratio, where the aspect ratio is defined as the ratio of $w_{o,max}$ to $w_{o,min}$. An axisymmetric beam cross section has an aspect ratio of 1.0, while elliptical and other non-axisymmetric beam cross sections have aspect ratios greater than 1.0, for example, greater than 1.1, greater than 1.2, greater than 1.3, greater than 1.4, greater than 1.5, greater than 1.6, greater than 1.7, greater than 1.8, greater than 1.9, greater than 2.0, greater than 3.0, greater than 5.0, greater than 10.0, or the like.

To promote uniformity of defects 172 in the beam propagation direction (e.g., depth dimension of the transparent workpiece 160), a laser beam 112 having low divergence may be used. In one or more embodiments, laser beams 112 having low divergence may be utilized for forming defects 172.

Beams with Gaussian intensity profiles may be less preferred for laser processing to form defects 172 because, when focused to small enough spot sizes (such as spot sizes in the range of microns, such as about 1-5 μm or about 1-10 μm) to enable available laser pulse energies to modify materials such as glass, they are highly diffracting and diverge significantly over short propagation distances. To achieve low divergence, it is desirable to control or optimize the intensity distribution of the pulsed laser beam to reduce diffraction. Pulsed laser beams may be non-diffracting or weakly diffracting. Weakly diffracting laser beams include quasi-non-diffracting laser beams. Representative weakly diffracting laser beams include Bessel beams, Gauss-Bessel beams, Airy beams, Weber beams, and Mathieu beams.

For non-axisymmetric beams, the Rayleigh ranges $Z_{Rx}$ and $Z_{Ry}$ are unequal. The values of $Z_{Rx}$ and $Z_{Ry}$ will accordingly vary, and each will have a minimum value and a maximum value that correspond to the principal axes, with the minimum value of $Z_{Rx}$ being denoted as $Z_{Rx,min}$ and the minimum value of $Z_{Ry}$ being denoted $Z_{Ry,min}$ for an arbitrary beam profile $Z_{Rx,min}$ and $Z_{Ry,min}$ can be shown to be given by $$Z_{Rx,min} = \frac{4\pi\sigma_{0,min}^2}{M_x^2 \lambda} \quad (5)$$

and $$Z_{Ry,min} = \frac{4\pi\sigma_{0,min}^2}{M_y^2 \lambda} \quad (6)$$

Since divergence of the laser beam occurs over a shorter distance in the direction having the smallest Rayleigh range, the intensity distribution of the laser beam 112 used to form defects 172 may be controlled so that the minimum values of $Z_{Rx}$ and $Z_{Ry}$ (or for axisymmetric beams, the value of $Z_R$) are as large as possible. Since the minimum value $Z_{Rx,min}$ of $Z_{Rx}$ and the minimum value $Z_{Ry,min}$ of $Z_{Ry}$ differ for a non-axisymmetric beam, a laser beam 112 may be used with an intensity distribution that makes the smaller of $Z_{Rx,min}$ and $Z_{Ry,min}$ as large as possible when forming damage regions.

In some embodiments, the smaller of $Z_{Rx,min}$ and $Z_{Ry,min}$ (or for axisymmetric beams, the value of $Z_R$) is greater than or equal to 50 μm, greater than or equal to 100 μm, greater than or equal to 200 μm, greater than or equal to 300 μm, greater than or equal to 500 μm, greater than or equal to 1 mm, greater than or equal to 2 mm, greater than or equal to 3 mm, greater than or equal to 5 mm, in the range from 50 μm to 10 mm, in the range from 100 μm to 5 mm, in the range from 200 μm to 4 mm, in the range from 300 μm to 2 mm, or the like.

The values and ranges for the smaller of $Z_{Rx,min}$ and $Z_{Ry,min}$ (or for axisymmetric beams, the value of $Z_R$) specified herein are achievable for different wavelengths to which the workpiece is transparent through adjustment of the spot size parameter $w_{o,min}$ defined in Equation (3). In some embodiments, the spot size parameter $w_{o,min}$ is greater than or equal to 0.25 μm, greater than or equal to 0.50 μm, greater than or equal to 0.75 μm, greater than or equal to 1.0 μm, greater than or equal to 2.0 μm, greater than or equal to 3.0 μm, greater than or equal to 5.0 μm, in the range from 0.25 μm to 10 μm, in the range from 0.25 μm to 5.0 μm, in the range from 0.25 μm to 2.5 μm, in the range from 0.50 μm to 10 μm, in the range from 0.50 μm to 5.0 μm, in the range from 0.50 μm to 2.5 μm, in the range from 0.75 μm to 10 μm, in the range from 0.75 μm to 5.0 μm, in the range from 0.75 μm to 2.5 μm, or the like.

Non-diffracting or quasi-non-diffracting beams generally have complicated intensity profiles, such as those that decrease non-monotonically vs. radius. By analogy to a Gaussian beam, an effective spot size $w_{o,eff}$ can be defined for non-axisymmetric beams as the shortest radial distance, in any direction, from the radial position of the maximum intensity (r=0) at which the intensity decreases to $1/e^2$ of the maximum intensity. Further, for axisymmetric beams $w_{o,eff}$ is the radial distance from the radial position of the maximum intensity (r=0) at which the intensity decreases to $1/e^2$ of the maximum intensity. A criterion for Rayleigh range based on the effective spot size $w_{o,eff}$ for non-axisymmetric beams or the spot size $w_o$ for axisymmetric beams can be specified as non-diffracting or quasi-non-diffracting beams for forming damage regions using equation (7) for non-axisymmetric beams or equation (8) for axisymmetric beams:

$$\text{Smaller of } Z_{Rx,min}, Z_{Ry,min} > F_D \frac{\pi w_{0,eff}^2}{\lambda} \quad (7)$$

$$Z_R > F_D \frac{\pi w_0^2}{\lambda} \quad (8)$$

where $F_D$ is a dimensionless divergence factor having a value of at least 10, at least 50, at least 100, at least 250, at least 500, at least 1000, in the range from 10 to 2000, in the range from 50 to 1500, in the range from 100 to 1000. For a non-diffracting or quasi-non-diffracting beam, the smaller of $Z_{Rx,min}$, $Z_{Ry,min}$ in Equation (7), over which the effective beam size doubles, is $F_D$ times the distance expected if a typical Gaussian beam profile were used. The dimensionless divergence factor $F_D$ provides a criterion for determining whether or not a laser beam is quasi-non-diffracting. As used herein, the laser beam 112 is considered quasi-non-diffracting if the characteristics of the laser beam satisfy Equation (7) or Equation (8) with a value of $F_D \geq 10$. As the value of $F_D$ increases, the laser beam 112 approaches a more nearly perfect non-diffracting state. Moreover, it should be understood that Equation (8) is merely a simplification of Equation (7) and as such, Equation (7) mathematically describes the dimensionless divergence factor $F_D$ for both axisymmetric and non-axisymmetric pulsed laser beams 112.

Figure 2C:
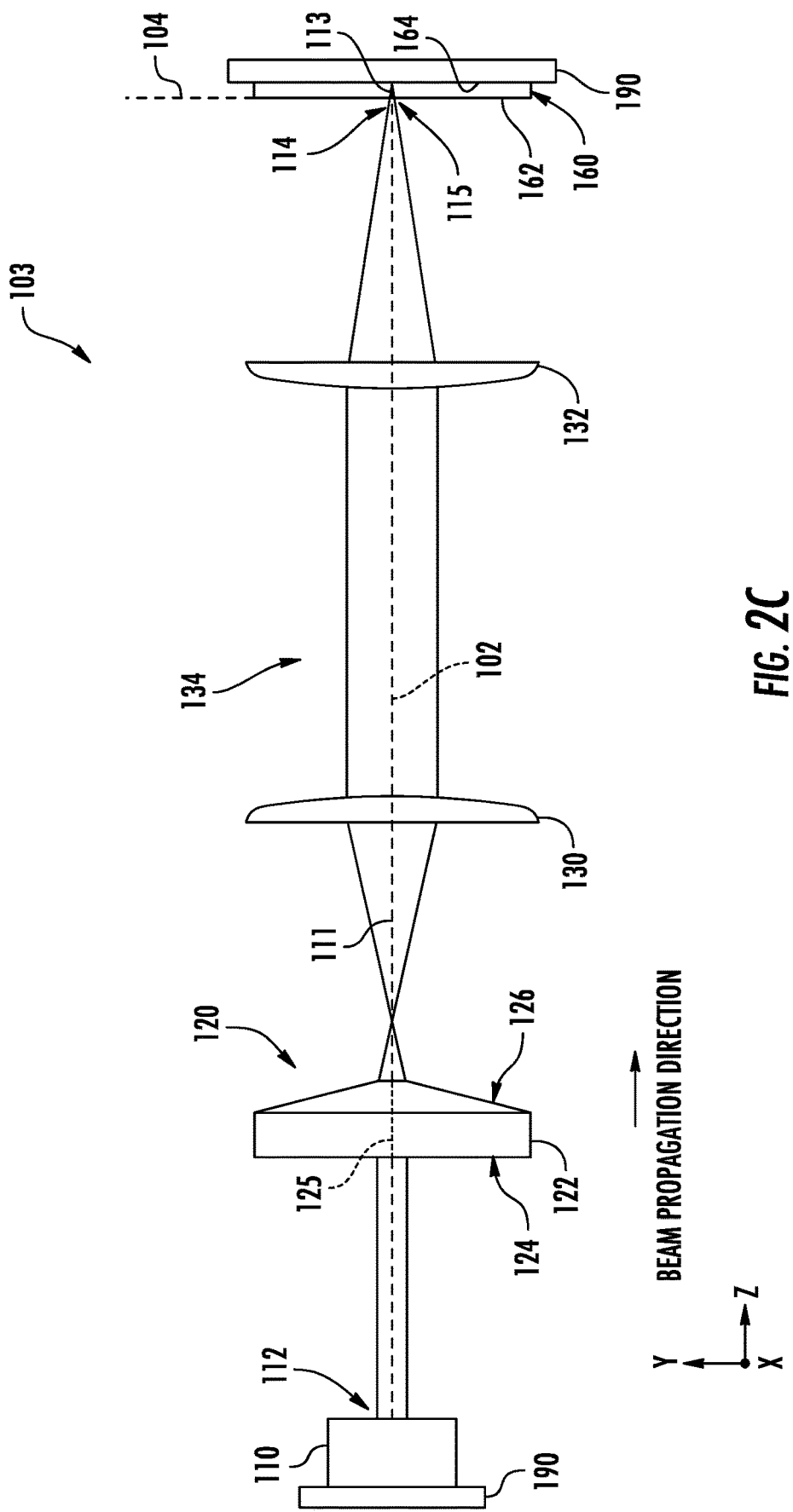
FIG. 2C schematically depicts an optical assembly of the laser processing system of FIG. 1A, according to one or more embodiments described herein.

Referring now to FIG. 2C, an optical assembly 103 for producing a laser beam 112 that is quasi-non-diffracting and that forms the laser beam focal line 113 at the substrate 160 using the aspheric optical element 120 (e.g., an axicon 122) is schematically depicted. The optical assembly 103 includes a beam source 110 that outputs the laser beam 112, first lens 130 and second lens 132. The beam source 110 may comprise any known or yet to be developed beam source 110 configured to output laser beams 112, for example, pulsed laser beams or continuous wave laser beams. In some embodiments, the beam source 110 may output a laser beam 112 comprising a wavelength of, for example, 1064 nm, 1030 nm, 532 nm, 530 nm, 355 nm, 343 nm, or 266 nm, or 215 nm. Further, the laser beam 112 used to form defects 172 in the substrate 160 may be well suited for materials that are transparent to the selected pulsed laser wavelength.

Further, the substrate 160 may be positioned such that the laser beam 112 output by the beam source 110 irradiates the substrate 160, for example, after traversing the aspheric optical element 120 and thereafter, both the first lens 130 and the second lens 132. An optical axis 102 extends between the beam source 110 and the substrate 160 (along the Z-axis in the embodiment depicted in FIG. 2C) such that when the beam source 110 outputs the laser beam 112, the beam pathway 111 of the laser beam 112 extends along the optical axis 102.

Suitable laser wavelengths for forming defects 172 are wavelengths at which the combined losses of linear absorption and scattering by the substrate 160 are sufficiently low. In embodiments, the combined losses due to linear absorption and scattering by the substrate 160 at the wavelength are less than 20%/mm, or less than 15%/mm, or less than 10%/mm, or less than 5%/mm, or less than 1%/mm, where the dimension "/mm" means per millimeter of distance within the substrate 160 in the beam propagation direction of the laser beam 112 (e.g., the Z direction). Representative wavelengths for many glass substrates include fundamental and harmonic wavelengths of $Nd^{3+}$ (e.g., $Nd^{3+}$:YAG or $Nd^{3+}$:YVO$_4$ having fundamental wavelength near 1064 nm and higher order harmonic wavelengths near 532 nm, 355 nm, and 266 nm). Other wavelengths in the ultraviolet, visible, and infrared portions of the spectrum that satisfy the combined linear absorption and scattering loss requirement for a given substrate material can also be used.

In operation, the laser beam 112 output by the beam source 110 may create multi-photon absorption (MPA) in the substrate 160. MPA is the simultaneous absorption of two or more photons of identical or different frequencies that excites a molecule from one state (usually the ground state) to a higher energy electronic state (i.e., ionization). The energy difference between the involved lower and upper states of the molecule is equal to the sum of the energies of the involved photons. MPA, also called induced absorption, can be a second-order or third-order process (or higher order), for example, that is several orders of magnitude weaker than linear absorption. It differs from linear absorption in that the strength of second-order induced absorption may be proportional to the square of the light intensity, for example, and thus it is a nonlinear optical process.

The perforation step that creates the contour line 165 (FIGS. 2A and 2B) may utilize the beam source 110 (e.g., a pulsed beam source such as an ultra-short pulse laser) in combination with the aspheric optical element 120, the first lens 130, and the second lens 132, to irradiate the substrate 160 and generate the laser beam focal line 113. The laser beam focal line 113 comprises a quasi-non-diffracting beam, such as a Gauss-Bessel beam or Bessel beam, as defined above, and may fully or partially perforate the substrate 160 to form defects 172 in the substrate 160, which may form the contour line 165. However, it is also contemplated that the laser beam focal line 113 is formed using a curve effect or filamentation. In embodiments in which the laser beam 112 comprises a pulsed laser beam, the pulse duration of the individual pulses is in a range of from about 1 femtosecond to about 200 picoseconds, such as from about 1 picosecond to about 100 picoseconds, 5 picoseconds to about 20 picoseconds, or the like, and the repetition rate of the individual pulses may be in a range from about 1 kHz to 4 MHz, such as in a range from about 10 kHz to about 3 MHz, or from about 10 kHz to about 650 kHz.

Figure 3B:
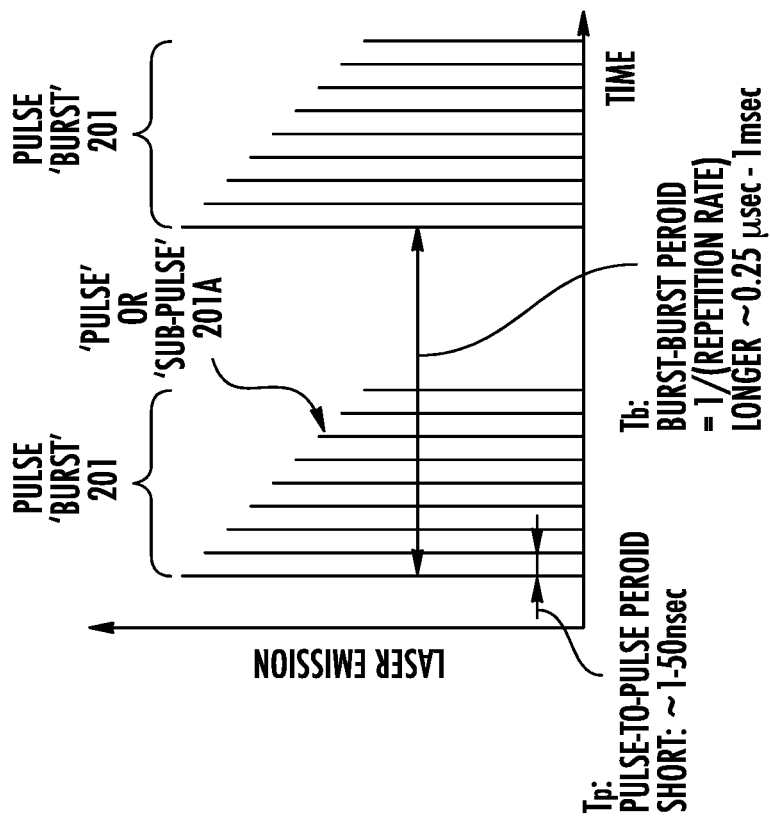
FIG. 3B graphically depicts the relative intensity of laser pulses vs. time within another exemplary pulse burst, according to one or more embodiments described herein.
Figure 3A:
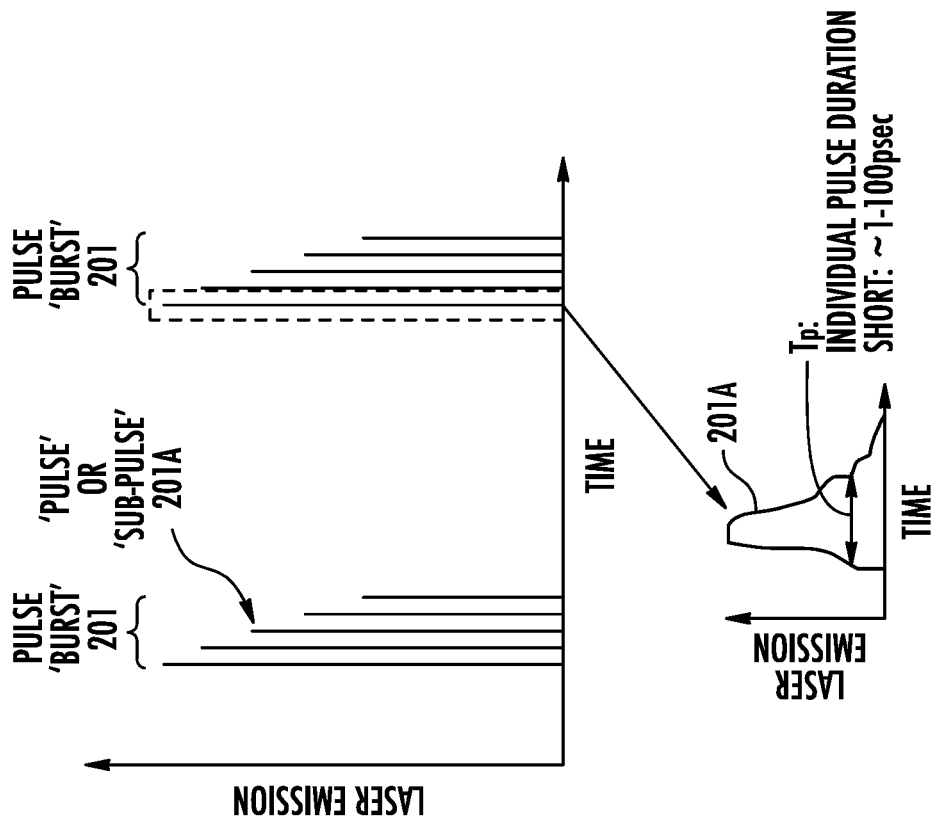
FIG. 3A graphically depicts the relative intensity of laser pulses within an exemplary pulse burst vs. time, according to one or more embodiments described herein.

Referring also to FIGS. 3A and 3B, in addition to a single pulse operation at the aforementioned individual pulse repetition rates, in embodiments comprising a pulsed laser beam, the pulses may be produced in pulse bursts 201 of two sub-pulses 201A or more (such as, for example, 3 sub-pulses, 4 sub-pulses, 5 sub-pulses, 10 sub-pulses, 15 sub-pulses, 20 sub-pulses, or more per pulse burst, such as from 1 to 30 sub-pulses per pulse burst 201, or from 5 to 20 sub-pulses per pulse burst 201). While not intending to be limited by theory, a pulse burst is a short and fast grouping of sub-pulses that creates an optical energy interaction with the material (i.e. MPA in the material of the substrate 160) on a time scale not easily accessible using a single-pulse operation. While still not intending to be limited by theory, the energy within a pulse burst (i.e. a group of pulses) is conserved. As an illustrative example, for a pulse burst having an energy of 100 μJ/burst and 2 sub-pulses, the 100 μJ/burst energy is split between the 2 pulses for an average energy of 50 μJ per sub-pulse and for a pulse burst having an energy of 100 μJ/burst and 10 sub-pulses, the 100 μJ/burst is split amongst the 10 sub-pulses for an average energy of 10 μJ per sub-pulse. Further, the energy distribution among the sub-pulses of a pulse burst does not need to be uniform. In fact, in some instances, the energy distribution among the sub-pulses of a pulse burst is in the form of an exponential decay, where the first sub-pulse of the pulse burst contains the most energy, the second sub-pulse of the pulse burst contains slightly less energy, the third sub-pulse of the pulse burst contains even less energy, and so on. However, other energy distributions within an individual pulse burst are also possible, where the exact energy of each sub-pulse can be tailored to effect different amounts of modification to the transparent workpiece 160.

While still not intending to be limited by theory, when the defects 172 of the one or more contours 170 are formed with pulse bursts having at least two sub-pulses, the force necessary to separate the substrate 160 along the contour line 165 (i.e. the maximum break resistance) is reduced compared to the maximum break resistance of a contour line 165 with the same spacing between adjacent defects 172 in an identical substrate 160 that is formed using a single pulse laser. For example, the maximum break resistance of a contour line 165 formed using a single pulse is at least two times greater than the maximum break resistance of a contour line 165 formed using a pulse burst having 2 or more sub-pulses. Further, the difference in maximum break resistance between a contour line 165 formed using a single pulse and a contour line 165 formed using a pulse burst having 2 sub-pulses is greater than the difference in maximum break resistance between a contour line 165 formed using a pulse burst having 2 sub-pulses and a pulse burst having 3 sub-pulses. Thus, pulse bursts may be used to form contour lines 165 that separate easier than contour lines 165 formed using a single pulse laser.

Referring still to FIGS. 3A and 3B, the sub-pulses 201A within the pulse burst 201 may be separated by a duration that is in a range from about 1 nsec to about 50 nsec, for example, from about 10 nsec to about 30 nsec, such as about 20 nsec. In other embodiments, the sub-pulses 201A within the pulse burst 201 may be separated by a duration of up to 100 psec (for example, 0.1 psec, 5 psec, 10 psec, 15 psec, 18 psec, 20 psec, 22 psec, 25 psec, 30 psec, 50 psec, 75 psec, or any range therebetween). For a given laser, the time separation $T_p$ (FIG. 3B) between adjacent sub-pulses 201A within a pulse burst 201 may be relatively uniform (e.g., within about 10% of one another). For example, in some embodiments, each sub-pulse 201A within a pulse burst 201 is separated in time from the subsequent sub-pulse by approximately 20 nsec (50 MHz). Further, the time between each pulse burst 201 may be from about 0.25 microseconds to about 1000 microseconds, e.g., from about 1 microsecond to about 10 microseconds, or from about 3 microseconds to about 8 microseconds.

In some of the exemplary embodiments of the beam source 110 described herein, the time separation $T_b$ (FIG. 3B) is about 5 microseconds for the beam source 110 outputting a laser beam 112 comprising a burst repetition rate of about 200 kHz. The laser burst repetition rate is related to the time $T_b$ between the first pulse in a burst to the first pulse in the subsequent burst (laser burst repetition rate=$1/T_b$). In some embodiments, the laser burst repetition rate may be in a range of from about 1 kHz to about 4 MHz. In embodiments, the laser burst repetition rates may be, for example, in a range of from about 10 kHz to 650 kHz. The time $T_b$ between the first pulse in each burst to the first pulse in the subsequent burst may be from about 0.25 microsecond (4 MHz burst repetition rate) to about 1000 microseconds (1 kHz burst repetition rate), for example from about 0.5 microseconds (2 MHz burst repetition rate) to about 40 microseconds (25 kHz burst repetition rate), or from about 2 microseconds (500 kHz burst repetition rate) to about 20 microseconds (50 k Hz burst repetition rate). The exact timing, pulse duration, and burst repetition rate may vary depending on the laser design, but short pulses ($T_d$<20 psec and, in some embodiments, $T_d$≤15 psec) of high intensity have been shown to work particularly well.

The burst repetition rate may be in a range of from about 1 kHz to about 2 MHz, such as from about 1 kHz to about 200 kHz. Bursting or producing pulse bursts 201 is a type of laser operation where the emission of sub-pulses 201A is not in a uniform and steady stream but rather in tight clusters of pulse bursts 201. The pulse burst laser beam may have a wavelength selected based on the material of the substrate 160 being operated on such that the material of the substrate 160 is substantially transparent at the wavelength. The average laser power per burst measured at the material may be at least about 40 µJ per mm of thickness of material. For example, in embodiments, the average laser power per burst may be from about 40 µJ/mm to about 2500 µJ/mm, or from about 500 µJ/mm to about 2250 µJ/mm. In a specific example, for 0.5 mm to 0.7 mm thick Corning EAGLE XG® substrate, pulse bursts of from about 300 µJ to about 600 µJ may cut and/or separate the substrate, which corresponds to an exemplary range of about 428 µJ/mm to about 1200 µJ/mm (i.e., 300 µJ/0.7 mm for 0.7 mm EAGLE XG® glass and 600 µJ/0.5 mm for a 0.5 mm EAGLE XG® glass).

The energy required to modify the substrate 160 is the pulse energy, which may be described in terms of pules burst energy (i.e., the energy contained within a pulse burst 201 where each pulse burst 201 contains a series of sub-pulses 201A), or in terms of the energy contained within a single laser pulse (many of which may comprise a burst). The pulse energy (for example, pulse burst energy) may be from about 25 µJ to about 750 µJ, e.g., from about 50 µJ to about 500 µJ, or from about 50 µJ to about 250 µJ. For some glass compositions, the pulse energy (e.g., pulse burst energy) may be from about 100 µJ to about 250 µJ. However, for display or TFT glass compositions, the pulse energy (e.g., pulse burst energy) may be higher (e.g., from about 300 µJ to about 500 µJ, or from about 400 µJ to about 600 µJ, depending on the specific glass composition of the substrate 160).

While not intending to be limited by theory, the use of a laser beam 112 comprising a pulsed laser beam capable of generating pulse bursts is advantageous for cutting and separating materials, for example glass materials. In contrast with the use of single pulses spaced apart in time by the repetition rate of the single-pulsed laser, the use of a burst sequence that spreads the pulse energy over a rapid sequence of pulses within the burst allows access to larger timescales of high intensity interaction with the material than is possible with single-pulse lasers. The use of pulse bursts (as opposed to a single pulse operation) increases the size (e.g., the cross-sectional size) of the defects 172, which facilitates the connection of adjacent defects 172 when separating substrate 160 along the one or more contour lines 165, thereby minimizing unintended crack formation. Further, using a pulse burst to form defects 172 increases the randomness of the orientation of cracks extending outward from each defect 172 into the bulk material of the substrate 160 such that individual cracks extending outward from defects 172 do not influence or otherwise bias the separation of the contour line 165 such that separation of the defects 172 follows the contour line 165, minimizing the formation of unintended cracks.

Referring again to FIG. 2C, the aspheric optical element 120 is positioned within the beam pathway 111 between the beam source 110 and the substrate 160. In operation, propagating the laser beam 112, e.g., an incoming Gaussian beam, through the aspheric optical element 120 may alter the laser beam 112 such that the portion of the laser beam 112 propagating beyond the aspheric optical element 120 is quasi-non-diffracting, as described above. The aspheric optical element 120 may comprise any optical element comprising an aspherical shape. In some embodiments, the aspheric optical element 120 may comprise a conical wavefront producing optical element, such as an axicon lens, for example, a negative refractive axicon lens, a positive refractive axicon lens, a reflective axicon lens, a diffractive axicon lens, a programmable spatial light modulator axicon lens (e.g., a phase axicon), or the like.

In some embodiments, the aspheric optical element 120 comprises at least one aspheric surface whose shape is mathematically described as: $z'=(cr^2/1)+(1-(1+k)(c^2r^2))^{1/2}+(a_1r+a_2r^2+a_3r^3+a_4r^4+a_5r^5+a_6r^6+a_7r^7+a_8r^8+a_9r^9+a_{10}r^{10}+a_{11}r^{11}+a_{12}r^{12}$ where z' is the surface sag of the aspheric surface, r is the distance between the aspheric surface and the optical axis 102 in a radial direction (e.g., in an X-direction or a Y-direction), c is the surface curvature of the aspheric surface (i.e. $c_i=1/R_i$, where R is the surface radius of the aspheric surface), k is the conic constant, and coefficients $a_i$ are the first through the twelfth order aspheric coefficients or higher order aspheric coefficients (polynomial aspheres) describing the aspheric surface. In one example embodiment, at least one aspheric surface of the aspheric optical element 120 includes the following coefficients $a_1$-$a_7$, respectively: −0.085274788; 0.065748845; 0.077574995; −0.054148636; 0.022077021; −0.0054987472; 0.0006682955; and the aspheric coefficients $a_8$-$a_{12}$ are 0. In this embodiment, the at least one aspheric surface has the conic constant k=0. However, because the $a_1$ coefficient has a nonzero value, this is equivalent to having a conic constant k with a non-zero value. Accordingly, an equivalent surface may be described by specifying a conic constant k that is non zero, a coefficient $a_1$ that is non-zero, or a combination of a nonzero k and a non-zero coefficient $a_1$. Further, in some embodiments, the at least one aspheric surface is described or defined by at least one higher order aspheric coefficients $a_2$-$a_{12}$ with non-zero value (i.e., at least one of $a_2$, $a_3$, ..., $a_{12}{\neq}0$). In one example embodiment, the aspheric optical element 120 comprises a third-order aspheric optical element such as a cubically shaped optical element, which comprises a coefficient $a_3$ that is non-zero.

In some embodiments, when the aspheric optical element 120 comprises an axicon 122 (as depicted in FIG. 2C), the axicon 122 may have a laser output surface 126 (e.g., conical surface) having an angle of about 1.2°, such as from about 0.5° to about 5°, or from about 1° to about 1.5°, or even from about 0.5° to about 20°, the angle measured relative to a laser input surface 124 (e.g., flat surface) upon which the laser beam 112 enters the axicon 122. Further, the laser output surface 126 terminates at a conical tip. Moreover, the aspheric optical element 120 includes a centerline axis 125 extending from the laser input surface 124 to the laser output surface 126 and terminating at the conical tip. In other embodiments, the aspheric optical element 120 may comprise a waxicon, a spatial phase modulator such as a spatial light modulator, or a diffractive optical grating. In operation, the aspheric optical element 120 shapes the incoming laser beam 112 (e.g., an incoming Gaussian beam) into a quasi-non-diffracting beam, which, in turn, is directed through the first lens 130 and the second lens 132.

Referring still to FIG. 2C, the first lens 130 is positioned upstream the second lens 132 and may collimate the laser beam 112 within a collimation space 134 between the first lens 130 and the second lens 132. Further, the second lens 132 may focus the laser beam 112 into the substrate 160, which may be positioned at an imaging plane 104. In some embodiments, the first lens 130 and the second lens 132 each comprise plano-convex lenses. When the first lens 130 and the second lens 132 each comprise plano-convex lenses, the curvature of the first lens 130 and the second lens 132 may each be oriented toward the collimation space 134. In other embodiments, the first lens 130 may comprise other collimating lenses and the second lens 132 may comprise a meniscus lens, an asphere, or another higher-order corrected focusing lens.

Figure 4A:
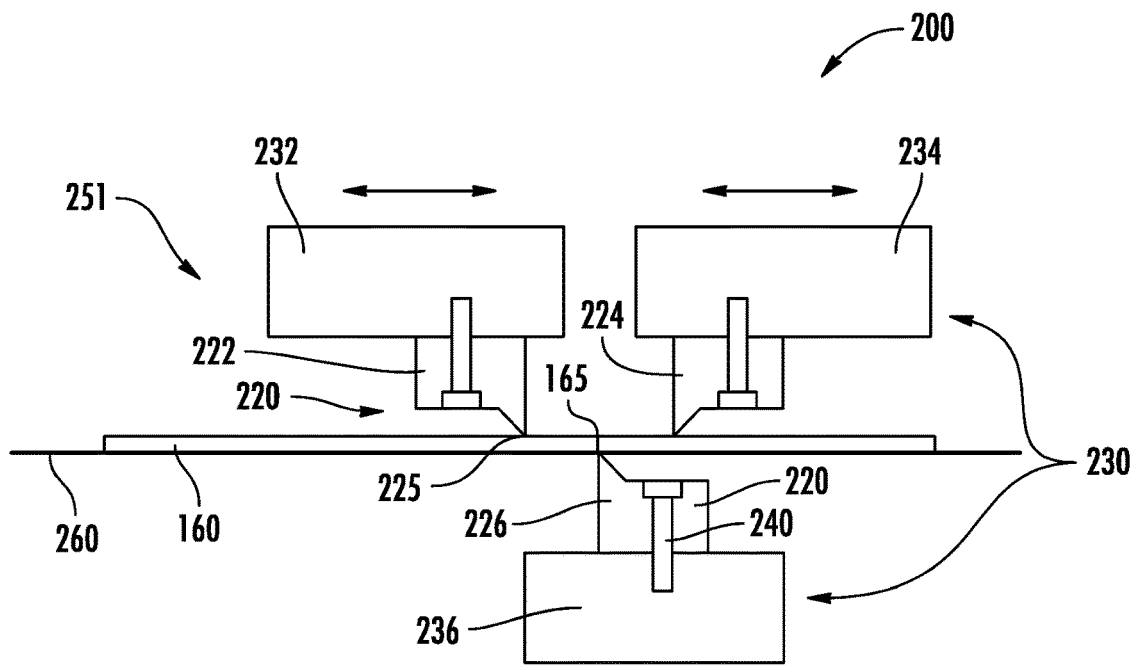
FIGS. 4A-4C schematically depict a substrate breaking system, according to one or more embodiments described herein.

Now referring to FIG. 4A, an exemplary substrate breaker system 200 applies a mechanical force to the substrate 160 to separate the substrate 160 along the contour line 165. Thus, substrate breaker system 200 separates the substrate 160 into at least two portions along the contour line 165.

As shown in FIG. 4A, substrate breaker system 200 comprises a plurality of breaker bars 220, which are each configured to apply a mechanical force to the substrate 160. As discussed further below, one or more of the breaker bars 220 can comprise a different length from one or more other breaker bars 220. In some embodiments, the breaker bars 220 are arranged into a plurality of sets of breaker bars (for example, wherein each set includes three individual breaker bars of the plurality of breaker bars 220). FIG. 4A, for example, shows a first set of breaker bars 251 that comprises a first breaker bar 222, a second breaker bar 224, and a third breaker bar 226. It is noted that the plurality of breaker bars 220 comprise at least the first, second, and third breaker bars 222, 224, 226. In the embodiment of FIG. 4A, the first set of breaker bars 251 comprises three breaker bars. First and second breaker bars 222, 224 are positioned on a first side of the substrate 160 (such as first surface 162, as shown in FIG. 2A), and third breaker bar 226 is positioned on a second side of the substrate 160 (such as second surface 164, as shown in FIG. 2A). However, it is also contemplated that the first and second breaker bars 222, 224 may be positioned on second surface 164 of the substrate 160 and that the third breaker bar 226 may be positioned on first surface 162 of the substrate 160.

The first and second breaker bars 222, 224 can move laterally such that the breaker bars can move toward and away from each other. Furthermore, the third breaker bar 226 can also move laterally relative to the first and second breaker bars 222, 224. Therefore, the third breaker bar 226 may be positioned in the middle between the first and second breaker bars 222, 224. Such also allows the breaker bars to each be placed in an exact location relative to the contour line 165, as discussed further below.

The plurality of breaker bars 220 each comprise an edge 225 with a sharp point, sharp line, rounded edge, or tapered edge for pressing on the substrate 160 to separate the substrate along the contour line 165. Thus, edge 225 is in contact with the substrate 160 during the separating process. As shown in FIG. 4A, in some embodiments, the edge 225 of the third breaker bar 226 is disposed on and along the contour line 165 and the edge 225 of the first and second breaker bars 222, 224 are disposed adjacent to but outside of the contour line 165. Thus, the edge 225 of the first and second breaker bars 222, 224 may be spaced a distance from the contour line 165 during the separating step. The distance between the edge 225 of the first breaker bar 222 and the contour line 165 may be the same or different from the edge 225 of the second breaker bar 224 and the contour line 165. Furthermore, the first and second breaker bars 222, 224 apply a downward pressure on the substrate 160 (according to FIG. 4A) and the third breaker bar 226 applies an upward pressure on the substrate 160 (according to FIG. 4A) in order to separate the substrate 160 along the contour line 165. However, it is noted that the terms "downward" and "upward" as used herein are merely used to depict the relative difference in pressure application and may vary depending on the orientation of the system 200.

The edges 225 of the first, second, and third breaker bars 222, 224, 226 can be formed of the same or different materials, can comprise the same or different edge angles (for example, an angle of the sharp point or taper at the edge 225), and have the same or different lengths and widths. The edges 225 provide minimum surface contact with the substrate 160 and provide a maximum force to a surface of the substrate 160 (e.g., surface 162 and/or surface 164). In some embodiments, the edges 225 may be a knife, blade, or sharp tip. In other embodiments, the edges 225 may have a tapered round edge.

The plurality of breaker bars 220 (including the edges 225 of each) can be formed of one or more hard materials for easily machining, such as metal, in particular stainless steel, or one or more softer materials for better flatness conformality, such as hard plastic. The length of the breaker bars 220 in embodiments is equal to or greater than the length of the contour line 165 in the substrate 160. In some embodiments, the length of the breaker bars exceeds about the length of the contour line 165 by about 10% or greater, or about 20% or greater, or about 30% or greater, or about 40% or greater of the length of the contour line 165. Thus, if the contour line 165 has a length of 400 mm, the length of a breaker bar is about 440 mm.

During the breaking processes disclosed herein, only the edge 225 of each breaker bar 220 contacts the substrate 160, thus reducing any damage to the substrate 160. In embodiments in which the substrate 160 comprises a coating (either on one or both of the first surface 162 and the second surface 164), only the edge 225 of each breaker bar 220 oriented directly to the coating contacts the coating, thus reducing any damage to the coating. The edges 225 may each have a very narrow tip, with a diameter ranging from about 100 microns to about 300 microns, or about 150 microns to about 25 microns.

As also shown in FIG. 4A, substrate 160 is disposed on a support 260. As discussed further below, the support 260 secures and holds the substrate 160 during the separating and cutting processes using the substrate breaker system 200. Additionally, the support 260 may also secure and hold the substrate 160 during the laser modification step using the laser processing system 100. In the embodiments that include the support 260, the edge 225 of the third breaker bar 226 may contact the support 260 (rather than the substrate 160) during the separating step and the first and second breaker bars 222, 224 may contact the substrate 160 directly. In other embodiments that include the support 260, the first and second breaker bars 222, 224 may contact the support 260 (rather than the substrate 160) and the third breaker bar 226 may contact the substrate 160 directly.

The plurality of breaker bars 220 are each secured to system 200 using, for example, one or more base members 230. For example, in the embodiment of FIG. 4A, the first breaker bar 222 is secured with a first base member 232, the second breaker bar 224 is secured with a second base member 234, and the third breaker bar 226 is secured with a third base member 236. Furthermore, each breaker bar 220 may comprise one or more holes 240 for attachment to the base members 230.

Figure 4B:
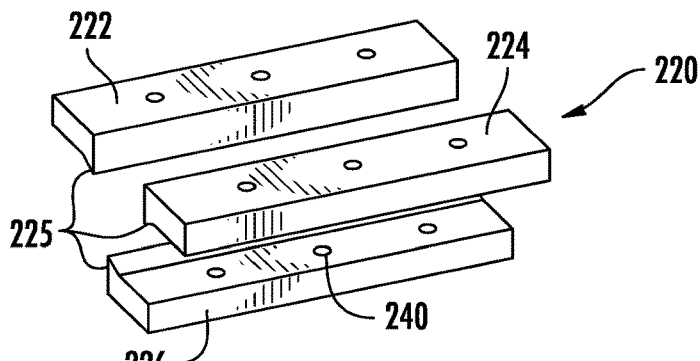
Figure 4C:
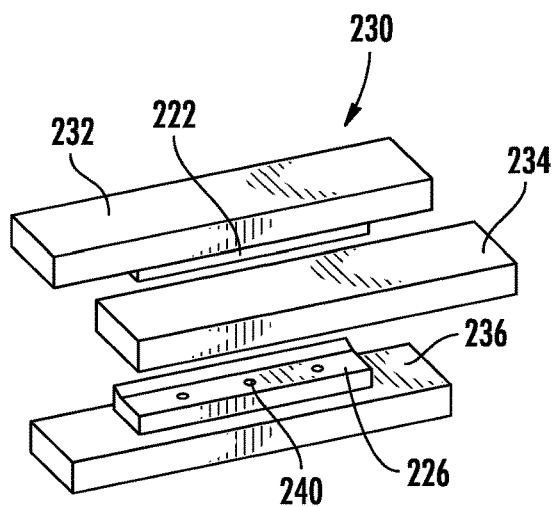

FIG. 4B shows an enlarged view of the breaker bars 220 of FIG. 4A. Additionally, FIG. 4C shows an enlarged view of the breaker bars 220 of FIG. 4A secured to the base members 230.

Figure 5A:
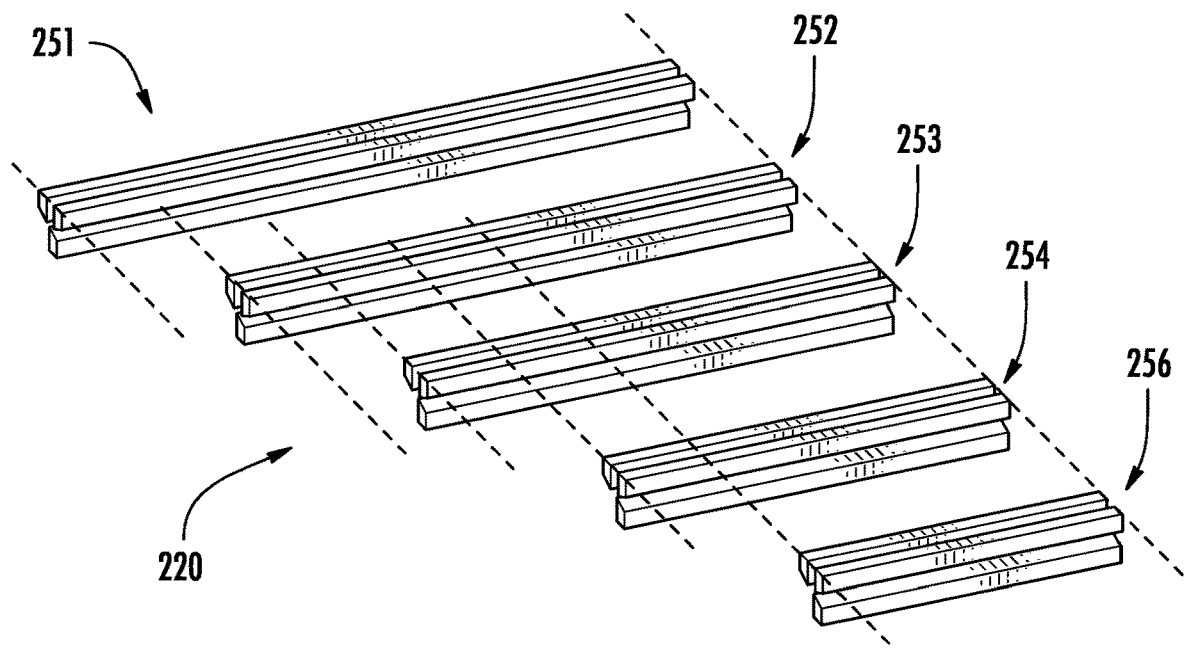
FIGS. 5A and 5B depict breaking bar sets of the substrate breaking system of FIGS. 4A-4C, according to one or more embodiments described herein.
Figure 5B:
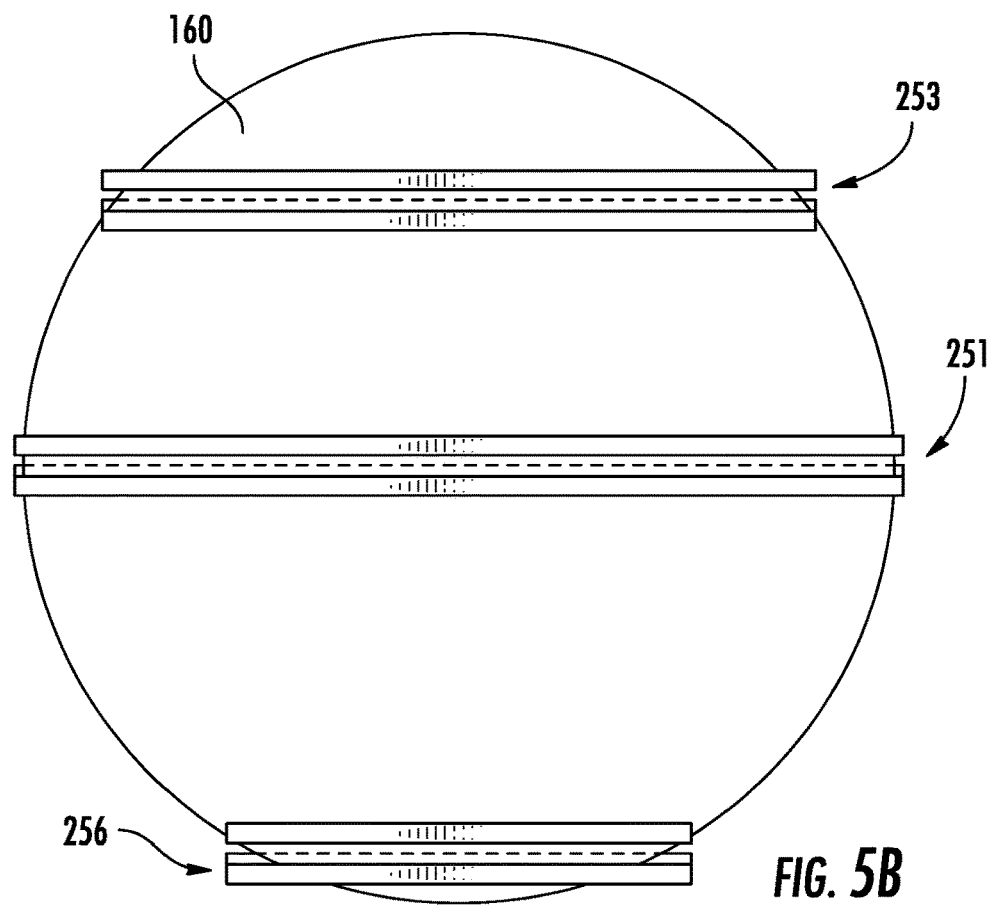

As discussed above, FIGS. 4A-4C show a first set of breaker bars 251 that comprise three breaker bars (222, 224, 226). It is also contemplated that system 200 comprises more than one set of breaker bars. It is also contemplated that each set of breaker bars may comprise more or less than three breaker bars. FIGS. 5A and 5B show embodiments wherein system 200 comprises more than one set of breaker bars used to separate a circular substrate 160. For example, as shown in FIGS. 5A and 5B, system 200 may comprise a plurality of sets of breaker bars (e.g., sets 251, 252, 253, 354, 255, 256). Each set comprises three breaker bars, such as first, second, and third breaker bars 222, 224, 226 as discussed above.

In some embodiments, the breaker bars of the different sets of breaker bars may comprise different lengths. For example, as shown in FIG. 5B, the breaker bars of the first set of breaker bars 251 may comprise the longest length and may be disposed at or near a centerline of the substrate 160. If the substrate 160 forms a shape other than the circle depicted in FIG. 5B, the longest breaker bar set would be disposed at the contour line 165 with the longest extension. The breaker bars of the third set of breaker bars 253, as shown in FIGS. 5A and 5B, may be shorter in length than the breaker bars of the first set of breaker bars 251. Furthermore, the third set of breaker bars 253 may positioned at an intermediate region of the substrate 160, for example between the centerline and an edge of the substrate 160. The breaker bars of the sixth set of breaker bars 256 may be shorter in length than the breaker bars of both the first and third set of breaker bars 251, 253. Furthermore, the sixth set of breaker bars 256 may be positioned at an edge portion (or close to the edge portion) of the substrate 160. In some embodiments, the breakers bars of the sixth set of breaker bars 256 may include the breaker bars with the shortest lengths of all of the breaker bars.

The plurality of breaker bars 220 may have different lengths depending on the size of the substrate 160. For example, the breaker bars 220 may each have a length of about 420 mm or less, or about 400 mm or less, or about 330 mm or less, or about 310 mm or less, or about 300 mm or less. Additionally or alternatively, the length of each breaker bar 220 may be about 300 mm or greater, or about 310 mm or greater, or about 330 mm or greater, or about 400 mm or greater, or about 420 mm or greater. In some embodiments, the length is in a range from about 300 mm to about 420 mm. Furthermore, one or more breaker bars 220 may differ from one or more other breaker bars 220 by a length of about 50 mm to about 80 mm, or about 55 mm to about 75 mm, or about 60 m to about 70 mm.

Figure 6:
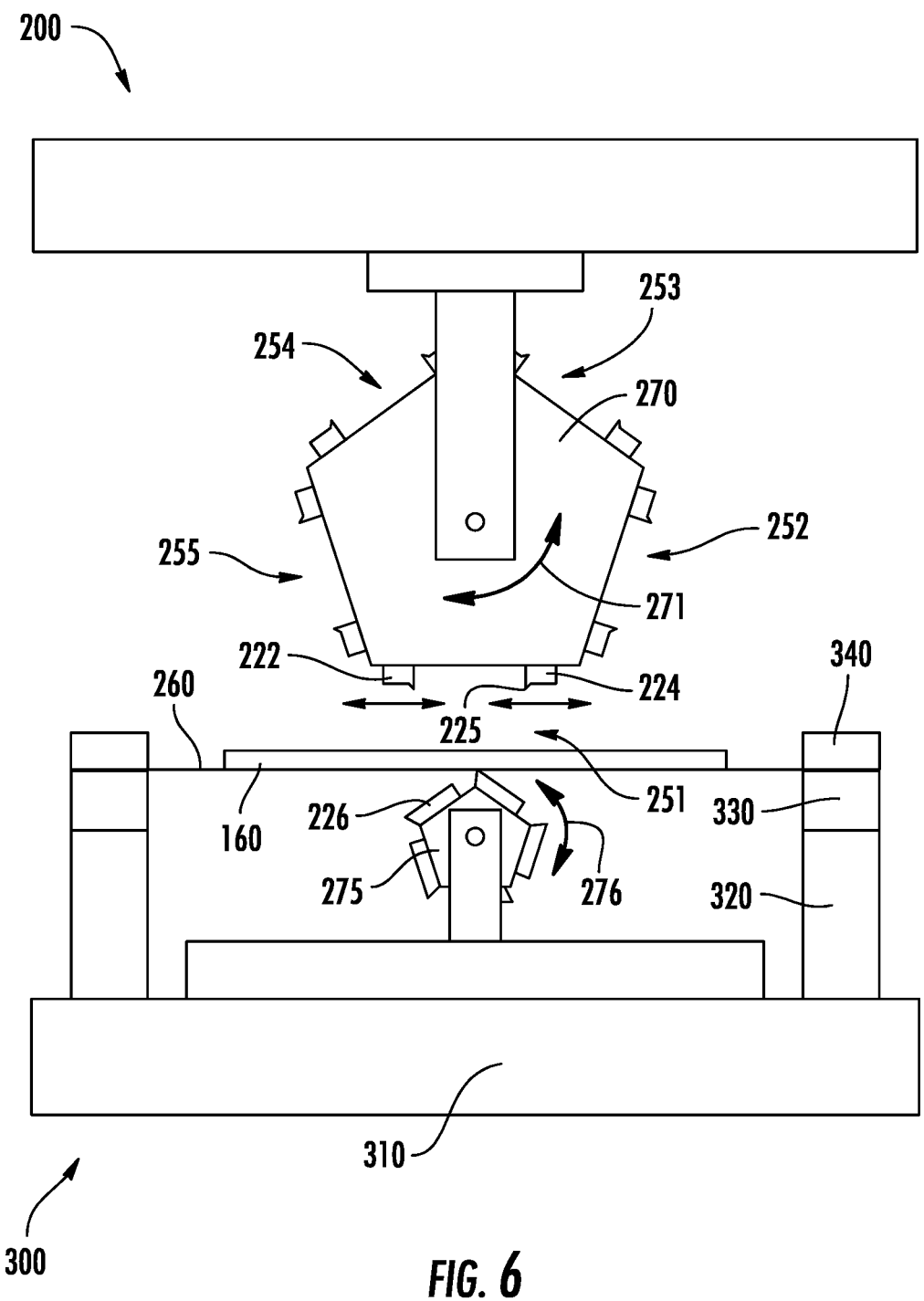
FIG. 6 schematically depicts a substrate breaking system, according to one or more embodiments described herein.

FIG. 6 illustrates a configuration for system 200 according to some embodiments. As shown in FIG. 6, the system comprises multiple sets of breaker bars, as disclosed above, with breaker bars of various lengths. Furthermore, the plurality of breaker bars 220 are disposed on a first rotating member 270 and on a second rotating member 275. More specifically, the top breaker bars (e.g., 222, 224) are disposed on the first rotating member 270 and the bottom breaker bars (e.g., 266) are disposed on the second rotating member 275. Each rotating member 270, 275 rotates in order to position a different set of breaker bars into position to separate and cut the substrate. For example, the first and second rotating members 270, 275 may first be rotated to position the first set of breaker bars 251 into position to separate and cut the substrate along a first contour line 165. Thus, the first and second breaker bars 22, 224 of the first set are positioned on top of the substrate 160 and adjacent to the first contour line 165 and the third breaker bar 226 of the first set is positioned on the bottom of the substrate 165 such that the edge 225 of the third breaker bar 226 is positioned on and along the first contour line 165 (as discussed above). The first set of breaker bars 251 may then apply pressure to the substrate 160 to separate the substrate along the first contour line 165.

Next, both the first and second rotating members 270, 275 may be rotated in order to position, for example, the third set of breaker bars 253 into position to separate the substrate along a second contour line 165. For example, the second contour line may be shorter in length than the first contour line and may require the breaker bars of the third set with the relatively shorter lengths. In another embodiment, the breaker bars of the third set 253 may have a different edge 225 (for example, a different tapered angle at the edge) than the breaker bars of the first set 251. Therefore, the first and second rotating members 270, 275 may be rotated to position the first and second breaker bars 222, 224 of the third set adjacent to the second contour line 165 and the third breaker bar 226 of the third set on the bottom of the substrate 165 such that the edge 225 of the third breaker bar 226 is positioned on and along the second contour line 165 (as discussed above). The third set of breaker bars 253 may then apply pressure to the substrate 160 to separate the substrate along the second contour line 165.

First rotating member 270 may rotate in a first rotating direction 271 and second rotating member 275 may rotate in a second rotating direction 276. First and second rotating directions 271, 276 may be in the same or different directions. Furthermore, first rotating member 270 may rotate simultaneously with second rotating member 275, such that they rotate together under the same control. It is also contemplated that first rotating member 270 rotates independently and separate from second rotating member 275.

In the embodiment of FIG. 6, first and second rotating members 270, 275 each form a pentagon in cross-section so that five set of breaker bars (251-255) are positioned on the rotating members. More specifically, each set of breaker bars is positioned on a face (side) of the pentagon. However, it is also contemplated that first and second rotating members 270, 275 may comprise other shapes and configurations. For example, the first and second rotating members 270, 275 may each form a square in cross-section such that four sets of breaker bars are positioned on the rotating members. In other embodiments, the first and second rotating members 270, 275 each form a triangle in cross-section such that three sets of breaker bars are positioned on the rotating members. It is also noted that other shapes and configurations may be used, as are well-known in the art.

As shown in FIG. 6, system 200 may further comprise a positioning assembly 300 configured to position the substrate 160 and/or the plurality of breaker bars 220. Although the positioning assembly 300 is shown in the embodiment of FIG. 6, it is noted that the positioning assembly 300 can be used with the other embodiments disclosed herein and is not limited to this embodiment. The positioning assembly 300 comprises a base 310 configured to support the assembly. Furthermore, the positioning assembly 300 comprises a linear positioning table 320 and a rotational table 330 that are configured to move and position the substrate 160 and the support 260. More specifically, the linear positioning table 320 is configured to move the substrate 160 and the support 260 in lateral X, Y, and Z directions (e.g., up, down, into the page, and out of the page). The rotational table 330 is configured to rotate the substrate 160 and the support 260 about either of the X axis, the Y axis, or the Z axis. For example, the rotational table 330 can rotate the substrate 160 so that a left end of the substrate 160 is higher than a right end of the substrate 160.

The positioning assembly 300 may further comprise a frame 340 for securing the support 260 on the system 200. The frame 340 can secure the support 260 using, for example, a magnetic element, a vacuum ring, or any other well-known attachment mechanisms.

The positioning assembly 300 may be a part of or may encompass the translation stage 190, as discussed above with reference to the laser processing system 100.

The linear positioning table 320 and rotational table 330 move the substrate 160 and the support 260 relative to the first rotating member 270 and to the second rotating member 275. Additionally or alternatively, the positioning system 300 may further comprise an assembly to position and move the first rotating member 270 and/or the second rotating member 275 relative to the substrate 160 and to the support 260. Additionally, as also discussed above, the breaker bars 220 in a specific set may move closer and further from each other to be precisely positioned relative to a contour line 165. For example, as shown in FIG. 6, first and second breaker bars 222, 224 may be moved closer together and further from each other along the lateral X-axis direction.

The positioning assemblies disclosed herein can be precision mechanisms that provide precisely controlled movements by, for example, motors. The assemblies may further include a camera to facilitate the alignment and positioning of the substrate 160 relative to the first and second rotating members 270, 275. The camera can also facilitate the alignment and positioning of the breaker bars 220 relative to the contour line 165. For example, the camera can enable the edges 225 of the breaker bars 220 to be precisely aligned relative to the contour lines 165 on the substrate.

The system can include a controller to automatically perform the breaking operation. The controller includes a processor and a memory in communication with the processor. The memory can be configured to store at least a portion of the information about the relative positioning of the components. In some embodiments of the present invention, the controller can be an integral part of the system. The controller can also be an add-on component for the system.

Figure 7A:
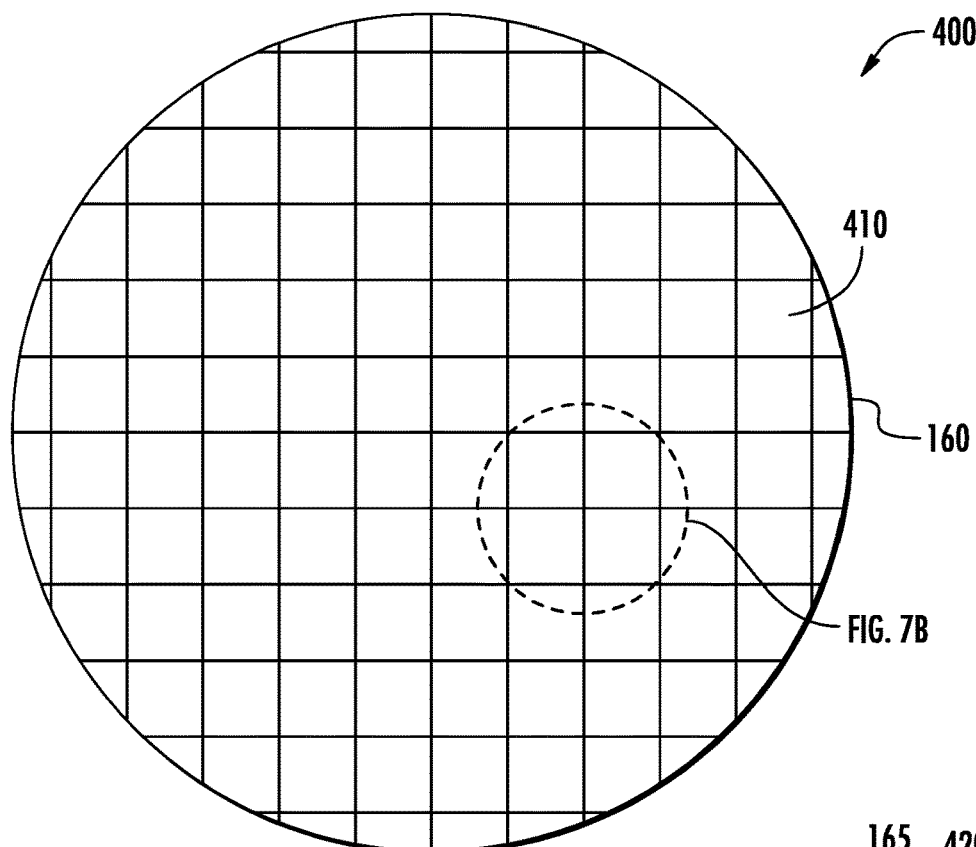
FIGS. 7A-7C depict the substrate breaking system with a substrate, according to one or more embodiments described herein.
Figure 7B:
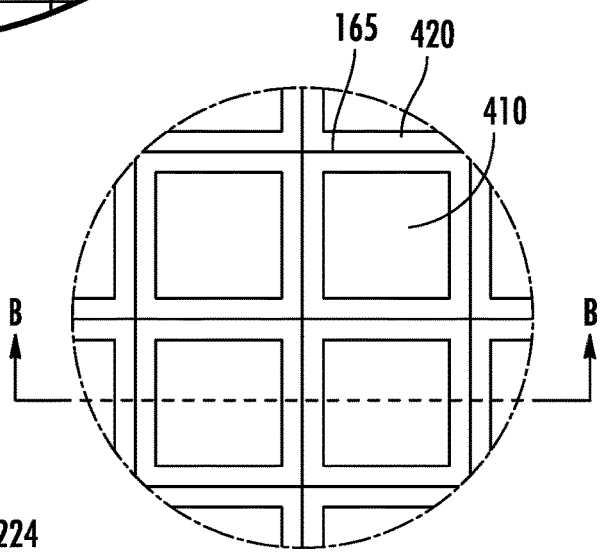
Figure 7C:
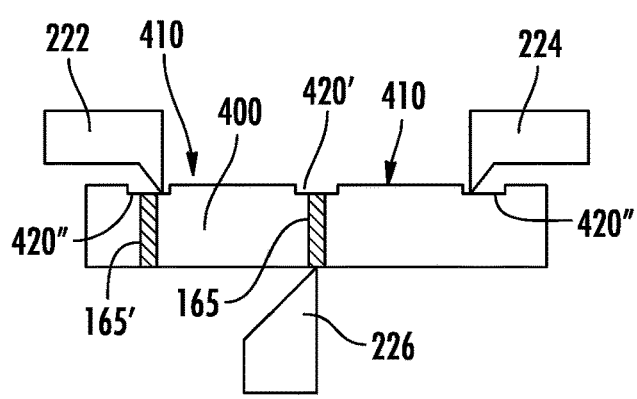

In some embodiments, substrate 160 comprises a plurality of dies fabricated thereon. For example, the substrate 160 may be a semiconductor wafer, a glass substrate, or an amorphous substrate having the plurality of dies fabricated thereon. To prevent damage to the fabricated devices, the plurality of breaker bars 220 only contacts the surface of the substrate 160 in the "non-sensitive areas" between the dies. For example, as shown in FIGS. 7A-7C substrate 160 comprises a semiconductor 400 with a plurality of dies 410 fabricated therein. A network of channels 420 is formed between the dies 410 and form the "non-sensitive areas" between the dies 410. System 200 is arranged such that the edges 225 of the plurality of breaking bars 220 only contact the channels 420 and do not contact the dies 410. Thus, in these embodiments, the laser processing system 100 produces the contour lines 165 only along and in the channels 420 and not within the dies 410. The plurality of breaking bars 220, therefore, do not damage the sensitive materials within the dies 410 when separating and cutting the semiconductor.

FIG. 7C (which is a cross-section of FIG. 7B along line B-B) shows an example in which the first set of breaking bars 251 is positioned relative to a contour line 165. In this embodiment, the contour line 165 is positioned along a first channel 420' that separates two dies 410. The first and second breaking bars 222, 224 are positioned on channels 420" adjacent to the two separate dies 410 such that the first and second breaking bars 222, 224 are separated from the contour line 165 by the two separate dies 410. The third breaking bar 226 is positioned on and along the contour line 165 on a bottom surface of the semiconductor 400.

It is also noted that the adjacent channels 420" may also comprise a contour line 165 formed therein. For example, as shown in FIG. 7C, one of the adjacent channels 420" has a second contour line 165' disposed therein. In such embodiments, the second breaking bar 222, when positioned in the adjacent channel 420" to separate the substrate along the contour line 165, should not contact the second contour line 165'. After the system 200 separates the substrate along the contour line 165, at least one of the system 200 or the substrate may be moved to position the components to separate the substrate along the second contour line 165'.

Figure 8A:
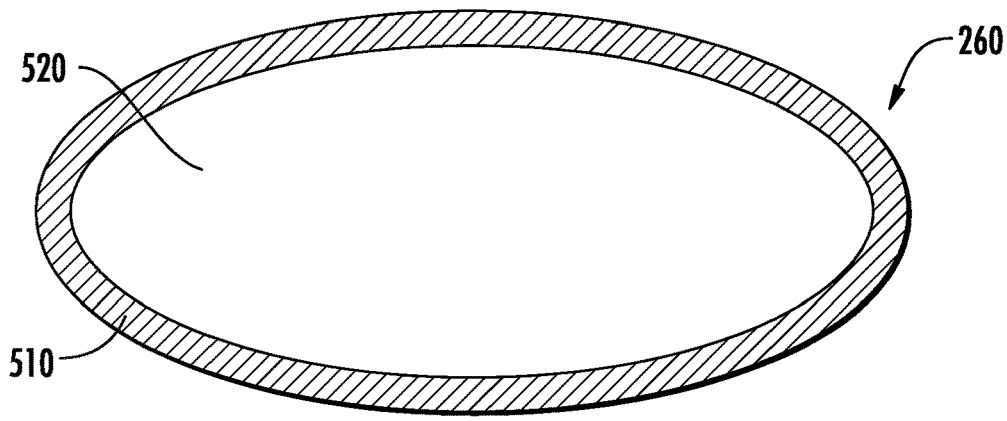
FIGS. 8A-8C depict a film of the substrate breaking system, according to one or more embodiments described herein.
Figure 8B:
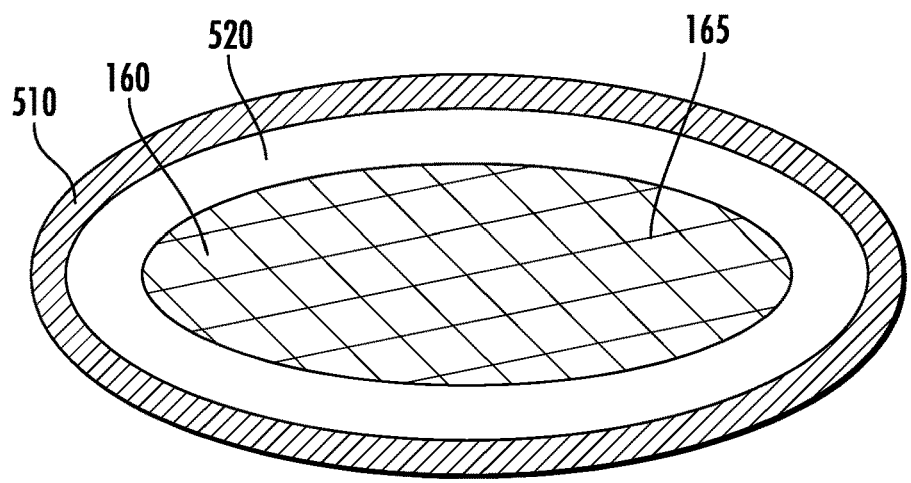
Figure 8C:
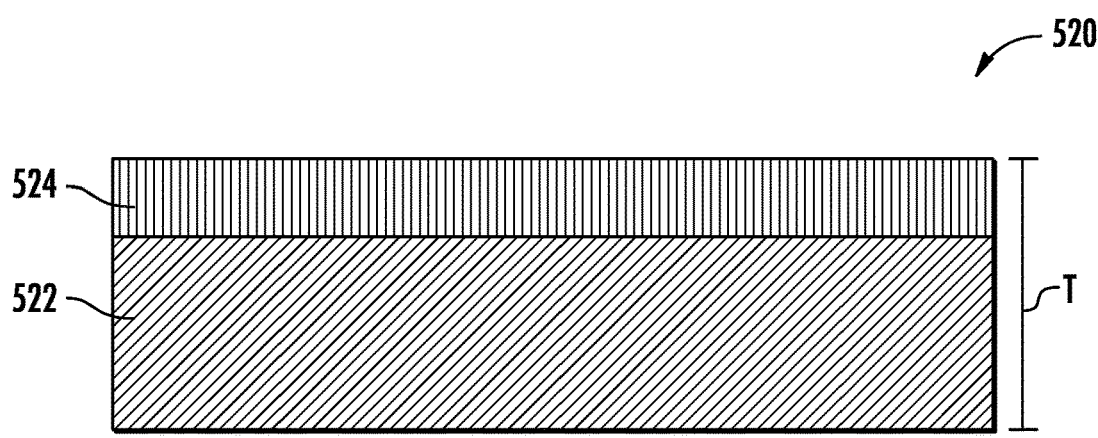

FIGS. 8A-8C illustrate a configuration of the support 260 according to embodiments disclosed herein. As shown in FIG. 8A, support 260 may comprise a frame 510 attached to a flexible membrane 520. The flexible membrane 520 may be a film, tape, sheet, or belt. In some embodiments, the flexible membrane 520 is stretched over the frame 510. The frame 510 may be the frame 340 discussed above with reference to FIG. 6 or part of the frame 340. As shown in FIG. 8B, the substrate 160 may be disposed on a top surface of the flexible membrane 520. Furthermore, as discussed further below, the contour lines 165 may be formed on the substrate 160 before or after mounting the substrate 160 on the support 260.

Flexible membrane 520 may comprise a polymeric material such as, for example, polyvinyl chloride (PVC) or poly olefin. In some embodiments, the material of flexible membrane 520 comprises silicon. In other embodiments, the material of flexible membrane 520 is free of silicon, which may advantageously reduce any contamination of the flexible membrane 520. Furthermore, the material of flexible membrane 250 may be resistant to the laser beam 112 such that it is not damaged by the laser beam. In further embodiments, the material of the flexible membrane 520 may be UV-insensitive.

The flexible membrane 520 may be sufficiently elastic to bend and stretch during the separating and/or cutting steps of substrate 160. For example, the flexible membrane 520 may be configured to bend and stretch upward and/or downward (in the embodiment of FIG. 4A) when first, second, and third breaker bars 222, 224, 226 apply pressure on the substrate 160 to break the substrate 160 along the contour line 165. In some embodiments, flexible membrane 520 has an elasticity of about 150% or greater in horizontal and/or vertical directions of the membrane, or about 160% or greater in horizontal and/or vertical directions, or about 200% or greater in horizontal and/or vertical directions. In some embodiments the elasticity in the horizontal direction may be different from the elasticity in the vertical direction. In some embodiments, the elasticity is about 150% in a horizontal direction and 170% in a vertical direction, or about 160% in a horizontal direction and about 200% in a vertical direction. Furthermore the elasticity may comprise a tensile strength of about 2 kg/25 mm or greater, or about 3 kg/25 mm or greater. In some embodiments, the tensile strength in the horizontal direction may be different from the tensile strength in the vertical direction. For example, the tensile strength in a horizontal direction may be about 3 kg/25 mm and the tensile strength in a vertical direction may be about 3 km/25 mm.

A total thickness T of the flexible membrane 520 may about 50 microns or greater, or about 60 microns or greater, or about 70 microns or greater, or about 80 microns or greater, or about 90 microns or greater, or about 100 microns or greater, or about 110 microns or greater, or about 120 microns or greater, or about 140 microns or greater, or about 160 microns or greater, or about 180 microns or greater, or about 200 microns or greater, or about 220 microns or greater, or about 240 microns or greater, or about 260 microns or greater. Additionally or alternatively, the thickness T of flexible membrane 520 may be about 280 microns or less, or about 260 microns or less, or about 240 microns or less, or about 220 microns or less, or about 200 microns or less, or about 180 microns or less, or about 160 microns or less, or about 140 microns or less, or about 120 microns or less, or about 110 microns or less, or about 100 microns or less, or about 90 microns or less, or about 80 microns or less, or about 70 microns or less. In some embodiments, the thickness T of flexible membrane 520 is in a range from about 50 microns to about 300 microns, or from about 80 microns to about 270 microns, or from about 90 microns to about 180 microns. For example, the thickness T may be about 80 microns, or about 95 microns, or about 98 microns, or about 130 microns, or about 168 microns, or about 268 microns.

As shown in FIG. 8C, in some embodiments, the flexible membrane 520 may comprise a base layer 522 and an adhesive layer 524. Substrate 160 may be secured to adhesive layer 524 of the flexible membrane 520. The base layer 522 may comprise the polymeric materials disclosed above. The adhesive layer 524 may comprise, for example, rubber and/or acrylic. In one embodiment, an adhesion of adhesive layer 524 is about 34 g/25 mm.

The base layer 522 may have a thickness ranging from about 70 microns to about 200 microns, or about 80 microns to about 180 microns, or about 100 microns to about 160 microns. In some embodiments, the thickness of the base layer 522 is about 70 microns, or about 80 microns, or about 115 microns, or about 125 microns The adhesive layer 524 may have a thickness ranging from about 5 microns to about 100 microns, or about 10 microns to about 90 microns, or about 15 microns to about 80 microns. In some embodiments, the thickness of the adhesive layer 524 is about 10 microns, or about 14, or about 15 microns. The thickness of the adhesive layer 524 may be smaller than the thickness of the base layer 522.

The flexible membrane 520 may comprise a backing film (not shown) formed of, for example, PET. In some embodiments, the backing film forms an anti-static layer. The backing film may have a thickness of about 10 microns or greater, or about 20 microns or greater, or about 25 microns or greater. The backing film can be applied to the base layer 522, the adhesive layer 524 or both. Furthermore, the backing film may enable a reduction of adhesion after UV curing to release separated pieces of the substrate.

The base layer 522 and the adhesive layer 524 may each be comprised of one unitary layer or a plurality of independent layers. For example, the layers 522 and/or 524 may each be formed of a laminate structure formed of a plurality of sub-layers. The sub-layers of each of 522 and/or 524 may be formed of the same or different materials.

Figure 9:
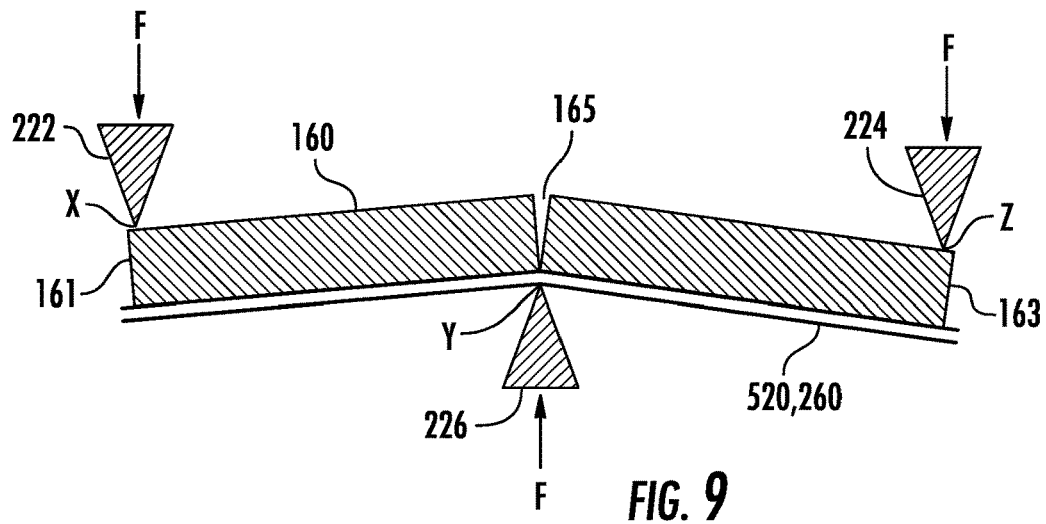
FIG. 9 depicts a breaking procedure of the substrate breaking system, according to one or more embodiments described herein.

When system 200 breaks the substrate 160 along the contour line 165, the substrate 160 may break into a first portion and a second portion. For example, as shown in FIG. 9, breaker bars 222, 224, 226 of system 200 break the substrate 160 into a first portion 161 and a second portion 163. More specifically, the first breaker bar 222 and the second breaker bar 224 apply a downward force on the substrate 160 and on the support 260. Furthermore, the third breaker bar 226 applies an upward force on the substrate 160 and on the support 260. Such force by the breaker bars 222, 224, 226 causes the substrate 160 to break along the contour line 165 and separate into the first portion 161 and the second portion 163. During this breaking procedure, the substrate 160 remains attached to the support 260. Therefore, as shown in FIG. 9, for example, the flexible membrane 520 of the support 260 bends upward with the movement of the first and second portions 161, 163 of the substrate 160. As discussed above, the flexible membrane 520 has sufficient elasticity to bend and flex with the movement of the first and second portions 161, 163. Such allows the substrate 160 to remain attached and secured to the flexible membrane 520 during the breaking procedure. This prevents the first and second portions 161, 163 from chipping or cracking during the breaking procedure. For example, by remaining secured to the flexible membrane 520, the first and second portions 161, 163 do not strike into each during or after the breaking procedure, which could cause chipping or cracking of the portions. Furthermore, by remaining secured to the flexible membrane 520, the first and second portions 161, 163 are prevented from inadvertently falling downward, such as to the ground.

In some embodiments, the first breaker bar 222 applies a first force F on the substrate 160 at a location X that is adjacent to the contour line 165. The third breaker bar 226 applies a second force F on the substrate 160 at location Y that is on or along the contour line 165. Furthermore, the second breaker 224 applies a third force F on the substrate 160 at a location Z that is adjacent to the contour line 165. The locations X and Z may be spaced from the contour line 165 by a distance that is sufficient to bend and break the substrate 160 but close enough not to overlap with the contour line 165. In some embodiments, the locations X and Z are spaced a distance of about 25 microns or greater from the contour line 165, or about 30 microns or greater, or about 35 microns or greater. It is also noted that the location X may be spaced a different length from the contour line 165 than the location Z. The first, second, and third forces F are sufficient to exceed the break resistance of the substrate 160 at the contour line 165 and, thus, break the substrate along the contour line 165. In some embodiments, the first force F is equal to the third force F. It is further noted that in the embodiments that include the flexible membrane 520, the first, second, and third forces F are also applied to the flexible tape 520.

The substrate 160 may be secured to the flexible membrane 520 either before or after the laser processing step using laser processing system 100. Therefore, in some embodiments, the substrate 160 is secured to the flexible membrane 520 before the laser processing step. Laser beam 112 then passes along beam pathway 111 to form the plurality of defects 172, which form contour line 165, while the substrate 160 is secured to the flexible membrane 520. Therefore, the laser beam 112 also passes through the flexible membrane 520 when forming the plurality of defects 172. In these embodiments, the flexible membrane 520 is formed of a material such that it is not damaged by the laser beam 112. In other embodiments, laser processing system 100 first forms the plurality of defects 172 of the contour line 165 and then, after the formation of the contour line 165, the substrate 160 is attached to the flexible membrane 520.

In some embodiments, the plurality of defects 172 may be enlarged prior to the breaking step using breaking system 200. For example, the defects 172 may be exposed to an etching solution, such as, for example, HF or KOH, or an ion-exchange process.

Figure 10:
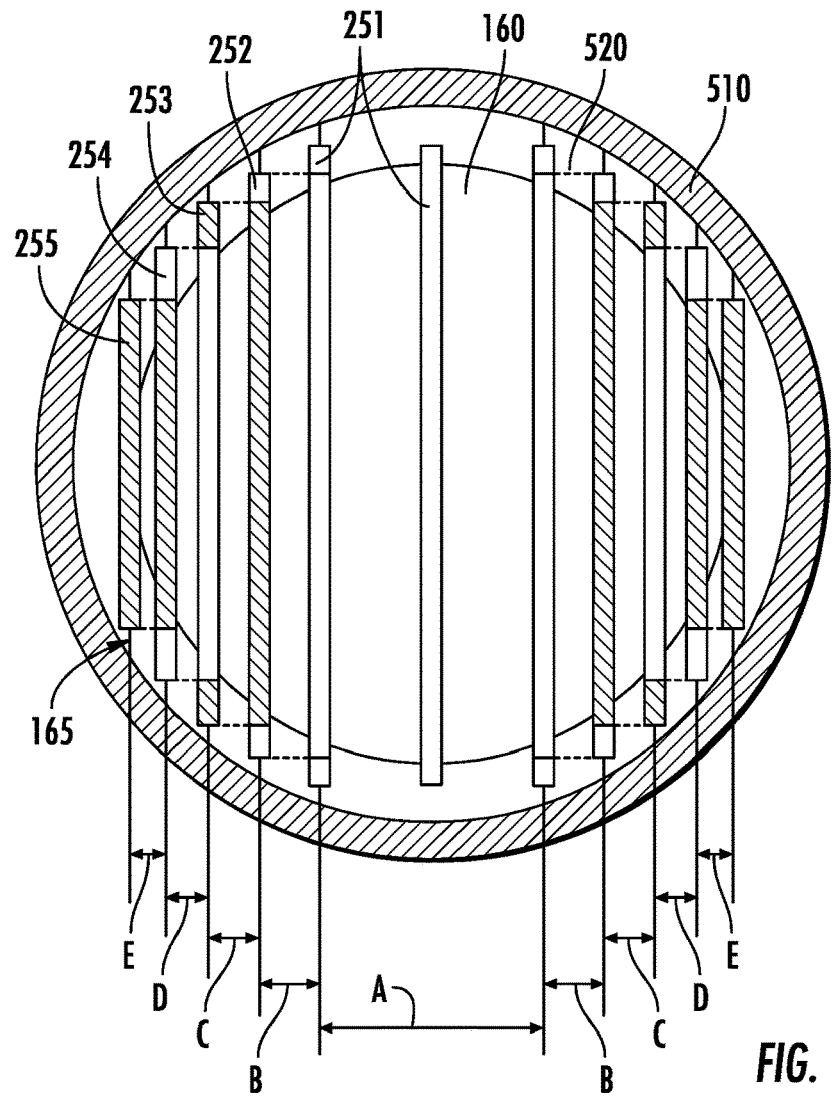
FIG. 10 depicts the substrate breaking system positioned on a substrate, according to one or more embodiments described herein.

FIG. 10 illustrates an exemplary configuration of five sets of breaker bars 251, 252, 253, 254, 255 of a breaking system 200 according to embodiments disclosed herein. In this embodiment, the substrate 160 is positioned on the flexible membrane 520 of the support 260. As discussed above, the breaker bars of the different sets (251, 252, 253, 254, 255) have different lengths. Therefore, for example, the breaker bars of the fifth set 255 are the shortest while the breaker bars of the first set 251 are the longest. The different lengths of the breaker bars may be suitable to break the substrate 160 along different portions of the substrate 160 corresponding to different lengths (e.g., diameters) of the substrate 160. For example, the first set of breaker bars 251 breaks the substrate 160 along contour lines 165 within a first region A, where the substrate 160 has the largest diameter (and, thus, the largest contour lines 165). The fifth set of breaker bars 255 breaks the substrate 160 along contour lines 165 within fifth regions E, where the substrate 160 has the smallest diameter. Furthermore, the second set of breaker bars 252 breaks the substrate along contour lines 165 within second regions B, the third set of breaker bars 253 breaks the substrate along contour lines 165 within third regions C, and the fourth set of breaker bars 254 breaks the substrate along contour lines 165 within fourth regions D. It is noted that the diameter of the fifth regions E is smaller than the diameter of the fourth regions D, the diameter of the fourth regions D is smaller than the diameter of the third regions C, the diameter of the third regions C is smaller than the diameter of the second regions B, and the diameter of the second regions B is smaller than the diameter of the first region A.

Figure 11A:
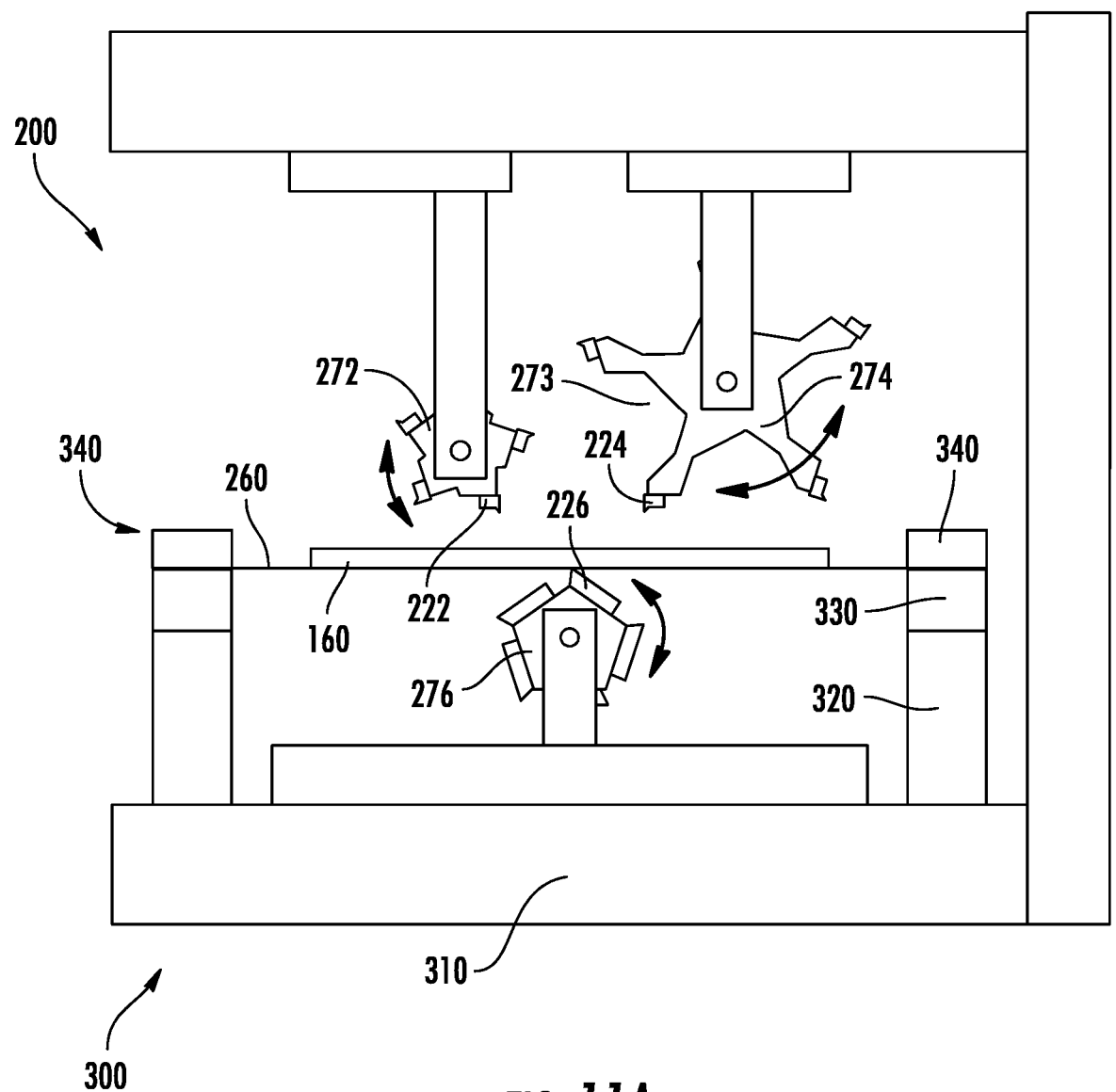
FIGS. 11A-11C schematically depict a substrate breaking system, according to one or more embodiments described herein.

FIG. 11A illustrates another embodiment of breaker system 200 in which the first breaker bars 222 are positioned on a first rotating member 272, the second breaker bars 224 are positioned on a second rotating member 274, and the third breaker bars 226 are positioned on a third rotating member 276. As discussed above, the rotating members 272, 274, 276 can be rotated to, for example, move a first set of breaker bars into position to break the substrate 160 along a first contour line 165. The rotating members 272, 274, 276 can further be rotated to, for example, move a second set of breaker bars into position to break the substrate along a second contour line 165.

Figure 11B:
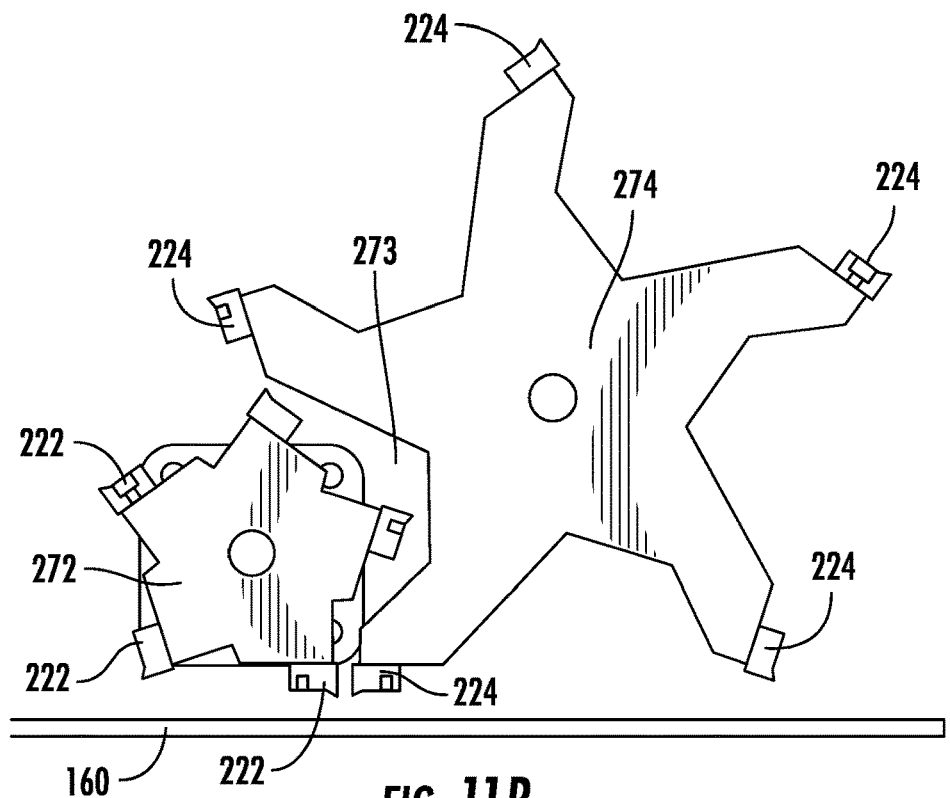

As further shown in FIGS. 11A and 11B, the first and second rotating members 272, 274 can move in the lateral X-axis direction with respect to each other (and with respect to the third rotating member 276). Such movement of the first and second rotating members 271, 272 provides exact positioning of the breaker bars with regard to the contour line 165. The second rotating member 274 may comprise cavities 273 between each breaker bar disposed thereon. The cavities 273 provide clearance and space for the first and second rotating members 272, 274 to move in close proximity without contacting each other.

Figure 11C:
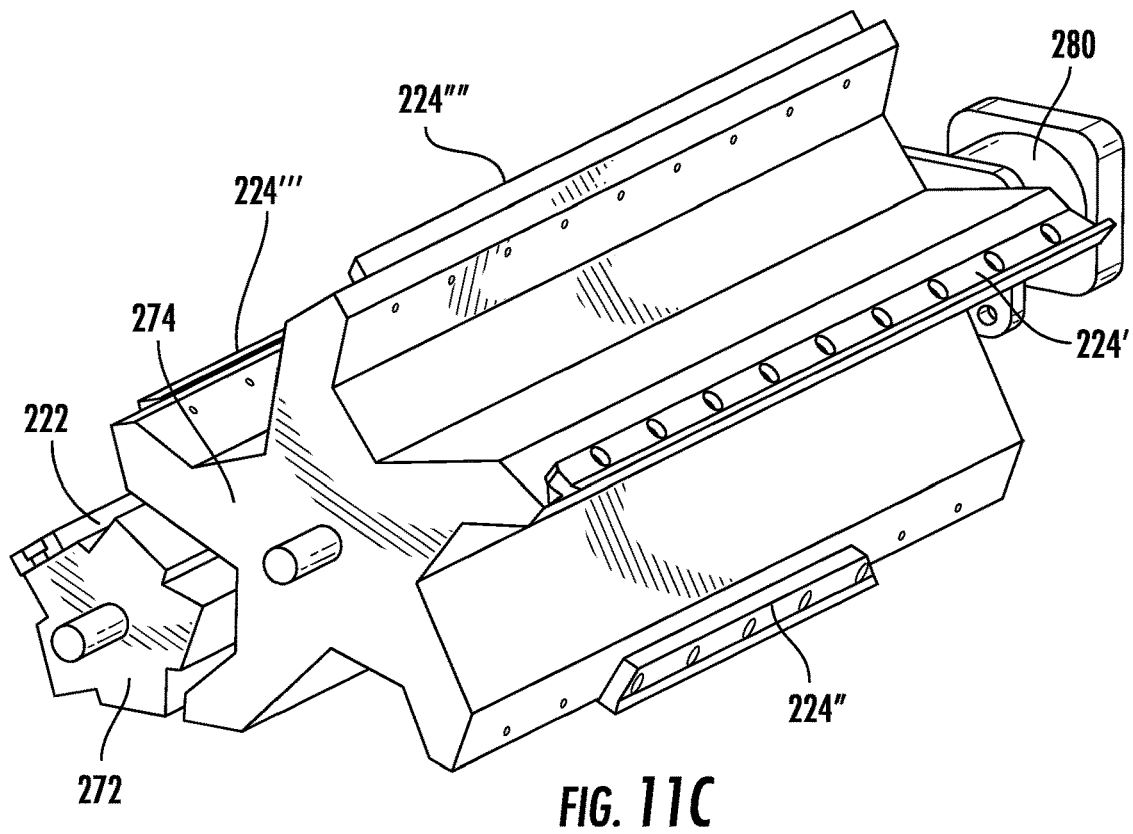

FIG. 11C shows a perspective view of a portion of the breaker system 200 according to embodiments disclosed herein. In particular, FIG. 11C shows the second breaker bars 224 positioned on the second rotating member 274. As discussed above, these second breaker bars 224 are each part of a different breaker bar set with different lengths. Therefore, for example, the second breaker bar 224' may be part of a first set and may have the longest length of all the second breaker bars. The second breaker bar 224" may be part of a second set and may have the shortest length of all the second breaker bars. Furthermore, the second breaker bar 224''' may have a longer length than second breaker bar 224" but shorter than second breaker bar 224'. The second breaker bar 224"" may have a longer length than second breaker bar 224" and 224''' but shorter than second breaker bar 224'.

Furthermore, FIG. 11C shows a rod 280 upon which the second rotating member 274 is mounted. The first and third rotating members 272, 276 may also be mounted on similar rods for rotation. Although the embodiment of FIG. 11C includes the breaker bars having different lengths, this feature is not limited to the embodiment of FIG. 11C. Instead, as discussed above, the different sized breaker bars may be used with any of the embodiments disclosed herein.

Figure 12:
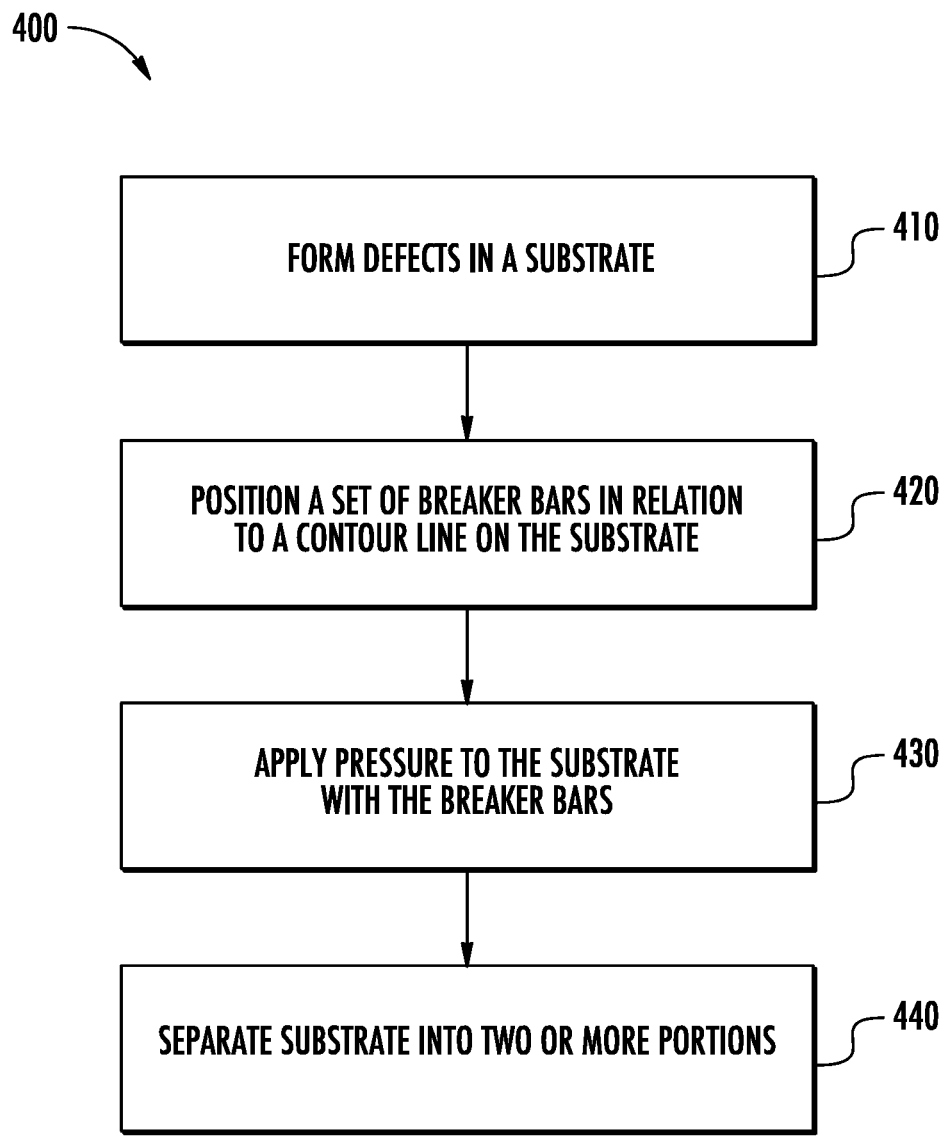
FIG. 12 depicts a process for cutting and separating a substrate, according to one or more embodiments described herein.

FIG. 12 illustrates a process 400 according to the embodiments disclosed herein. In step 410, the process 400 comprises forming one or more defects 172 in substrate 160. As discussed above, the defects 172 may be formed using the laser beam 112, and the defects 172 may together form a contour line 165. During the formation of the defects 172, the substrate 160 may or may not be disposed on flexible membrane 520 of support 260. In step 420, a set of breaker bars is positioned on the substrate 160 in relation to the contour line 165. More specifically, in some embodiments, two top breaker bars (of a first set) are positioned on a top surface of the substrate 160 and adjacent to the contour line and a bottom breaker bar (of the first set) is positioned on a bottom surface of the substrate 160 and on the contour line 165. In step 430, the breaker bars apply pressure (force) to the substrate 160 to separate the substrate 160 along the contour line 165. Thus, the substrate 160 is separated into two separate portions (step 440). During these separation steps, the substrate 160 may be positioned and secured on the flexible membrane 520 so that the separated portions of the substrate 160 do not chip or crack.

It is noted that during the formation of the defects 172 in the substrate 160 (step 410 of process 400), the substrate 160 remains intact and is not separated into two portions. Thus, there is no material removal or mechanical force present during this step. Instead, the substrate 160 is separated (by the mechanical force of the breaker bars 220) only during steps 430 and 440 of process 400. Therefore, embodiments of the present disclosure comprise forming a plurality of defects 172 within a substrate 160 to form a contour line 165 while the substrate 160 is attached to a flexible membrane 520 and before the substrate 165 is separated into different portions.

As disclosed above, the laser processing system 100 provides a highly controlled system in which the contour line 165 is produced with a high degree of control and specificity. Furthermore, the breaking system 200 is able to precisely control the locations of the breaker bars 220 to separate the substrate 160 only along the contour line 165. Therefore, the cutting and separating of the substrate 160 can be controlled to achieve a very precise and accurate cutting line. Furthermore, by first forming the contour line 165 and then separating the substrate along the contour line 165, the breaking force required to separate the substrate 160 is much lower than in traditional systems, which leads to improved edge quality. In particular any chipping at the cut edge of the substrate 160 may be about 80 microns or less, or about 50 microns or less, or about 20 microns or less.

Embodiments of the present disclosure also allow for the breaker bars 220 to be positioned at locations that do not interfere with any sensitive materials on the substrate 160. Furthermore, embodiments of the present disclosure provide a system that can cut and separate substrates with very low coefficient of thermal expansion (CTE) values and/or very small aspect ratios (e.g., substrates that are very thin and wide). In some embodiments, the glass substrate 160 is formed of HPFS glass with a CTE value of about 0.4 ppm/° C. or less. In other embodiments, the glass substrate 160 is Eagle XG glass with a CTE of about 3.5 ppm/° C. or less. Therefore, system 10 can be used with a greater variety of substrates than traditional systems.

Additionally, the embodiments of the present disclosure cut and break a substrate while not damaging any coating applied on the substrate. Embodiments of the present disclosure are also able to cut and separate substrates with very large thicknesses.

While various embodiments have been described herein, they have been presented by way of example, and not limitation. It should be apparent that adaptations and modifications are intended to be within the meaning and range of equivalents of the disclosed embodiments, based on the teaching and guidance presented herein. It therefore will be apparent to one skilled in the art that various changes in form and detail can be made to the embodiments disclosed herein without departing from the spirit and scope of the present disclosure. The elements of the embodiments presented herein are not necessarily mutually exclusive, but may be interchanged to meet various situations as would be appreciated by one of skill in the art.

Embodiments of the present disclosure are described in detail herein with reference to embodiments thereof as illustrated in the accompanying drawings, in which like reference numerals are used to indicate identical or functionally similar elements. References to "one embodiment," "an embodiment," "some embodiments," "in certain embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The examples are illustrative, but not limiting, of the present disclosure. Other suitable modifications and adaptations of the variety of conditions and parameters normally encountered in the field, and which would be apparent to those skilled in the art, are within the spirit and scope of the disclosure.

The term "or," as used herein, is inclusive; more specifically, the phrase "A or B" means "A, B, or both A and B." Exclusive "or" is designated herein by terms such as "either A or B" and "one of A or B," for example.

The indefinite articles "a" and "an" to describe an element or component means that one or at least one of these elements or components is present. Although these articles are conventionally employed to signify that the modified noun is a singular noun, as used herein the articles "a" and "an" also include the plural, unless otherwise stated in specific instances. Similarly, the definite article "the," as used herein, also signifies that the modified noun may be singular or plural, again unless otherwise stated in specific instances.

As used in the claims, "comprising" is an open-ended transitional phrase. A list of elements following the transitional phrase "comprising" is a non-exclusive list, such that elements in addition to those specifically recited in the list may also be present. As used in the claims, "consisting essentially of" or "composed essentially of limits the composition of a material to the specified materials and those that do not materially affect the basic and novel characteristic(s) of the material. As used in the claims," consisting of or "composed entirely of" limits the composition of a material to the specified materials and excludes any material not specified.

The term "wherein" is used as an open-ended transitional phrase, to introduce a recitation of a series of characteristics of the structure.

Where a range of numerical values is recited herein, comprising upper and lower values, unless otherwise stated in specific circumstances, the range is intended to include the endpoints thereof, and all integers and fractions within the range. It is not intended that the scope of the claims be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. Finally, when the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about."

As used herein, the term "about" means that amounts, sizes, ranges, formulations, parameters, and other quantities and characteristics are not and need not be exact, but may be approximate and/or larger or smaller, as desired, reflecting tolerances, conversion factors, rounding off, measurement error and the like, and other factors known to those of skill in the art.

The present embodiment(s) have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

It is to be understood that the phraseology or terminology used herein is for the purpose of description and not of limitation. The breadth and scope of the present disclosure should not be limited by any of the above-described exemplary embodiments, but should be defined in accordance with the following claims and their equivalents.

What is claimed is:

1. A method comprising:
   forming a plurality of defects within a first channel of a plurality of channels of a substrate with a laser beam focal line using a laser beam, the plurality of channels being disposed between dies within the substrate, each defect of the plurality of defects being a damage track within the first channel of the substrate with a diameter of about 10 microns or less, and the plurality of defects forming a contour line in the first channel of the substrate,
   the substrate having a first surface and a second surface that is opposite from the first surface;
   exerting (i) a first force on the first surface of the substrate within a second channel of the plurality of channels at a location that is adjacent to the contour line and a second force on the second surface of the substrate at a location that is on the contour line;
   breaking the substrate along the contour line and into a first substrate portion and a second substrate portion; and
   further comprising exerting a third force on the first surface of the substrate within a third channel of the plurality of the channels at a location that is adjacent to the contour line and at an opposite side of the contour line than the first force.

2. The method of claim 1, wherein the third force is equal to the first force.

3. The method of claim 1, further comprising exerting the first force with a first breaker bar, the first breaker bar only contacting the substrate at an edge of the breaker bar.

4. The method of claim 1, wherein the substrate is disposed on a flexible membrane, the method further comprising exerting the second force on the flexible membrane and on the second surface of the substrate.

5. The method of claim 4, wherein the flexible membrane bends and flexes due to the exertion of at least one of the first force and the second force.

6. The method of claim 4, wherein the flexible membrane is comprised of a polymeric material.

7. The method of claim 4, wherein the flexible membrane has a thickness of about 50 microns to about 300 microns.

8. The method of claim 4, wherein the flexible membrane has an elasticity of about 120% or more in a horizontal direction of the flexible membrane and about 120% or more in a vertical direction of the flexible membrane.

9. The method of claim 1, wherein the diameter of the damage track is about 5 microns or less.

10. The method of claim 1, wherein the substrate is comprised of a glass substrate, a glass-ceramic substrate, or a semiconductor wafer.

11. The method of claim 1, further comprising:
    forming a second plurality of defects within the substrate with the laser beam, each defect of the second plurality of defects being a damage track within the substrate with a diameter of about 10 microns or less, the second plurality of defects forming a second contour line on the substrate; and
    exerting (i) a fourth force on the first surface of the substrate at a location that is adjacent to the second contour line and (ii) a fifth force on the second surface of the substrate at a location that is on the second contour line; and
    breaking the substrate along the second contour line and into a third substrate portion and a fourth substrate portion.

12. A system comprising:
    a laser processing system comprising a beam source configured to output a laser beam that is focused into a laser beam focal line; and
    a substrate breaking system comprising a first set of breaker bars and a flexible membrane,
        the first set of breaker bars comprising a first breaker bar with a first edge, a second breaker bar with a second edge, and a third breaker bar with a third edge, and
        the first breaker bar and the second breaker bar being disposed on a first side of the flexible membrane and the third breaker bar being disposed on a second side of the flexible membrane, and
    the flexible membrane comprising a base layer and an adhesive layer such that a thickness of the adhesive layer is less than a thickness of the base layer.

13. The system of claim 12, further comprising a second set of breaker bars comprising a first breaker bar, a second breaker bar, and a third breaker bar, wherein:

the first breaker bar of the second set of breaker bars has a shorter length than the first breaker bar of the first set of breaker bars, the second breaker bar of the second set of breaker bars has a shorter length than the second breaker bar of the first set of breaker bars, the third breaker bar of the second set of breaker bars has a shorter length than the third breaker bar of the first set of breaker bars.

14. The system of claim 13, further comprising a first rotating member, the first breaker bar and the second breaker bar being disposed on the first rotating member.

15. The system of claim 12, wherein the first breaker bar and the second breaker bar are disposed on a single side of the first rotating member.

16. The system of claim 12, further comprising a second rotating member, the third breaker bar being disposed on the second rotating member.

17. The system of claim 12, wherein the flexible membrane is comprised of a polymeric material.

18. The system of claim 17, wherein the flexible membrane has a thickness of about 50 microns to about 300 microns.

19. The system of claim 12, wherein the flexible membrane has an elasticity of about 120% or more in a horizontal direction of the flexible membrane and about 120% or more in a vertical direction of the flexible membrane.

* * * * *